(12) United States Patent
Seo et al.

(10) Patent No.: US 7,651,788 B2
(45) Date of Patent: Jan. 26, 2010

(54) ORGANIC ELECTROLUMINESCENT DEVICE

(75) Inventors: Jeong Dae Seo, Gyeonggi-do (KR); Hee Jung Kim, Seoul (KR); Kyung Hoon Lee, Seoul (KR); Hyoung Yun Oh, Seoul (KR); Myung Seop Kim, Seoul (KR); Chun Gun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/792,130

(22) Filed: Mar. 4, 2004

(65) Prior Publication Data

US 2004/0209118 A1  Oct. 21, 2004

(30) Foreign Application Priority Data

Mar. 5, 2003 (KR) ............... 10-2003-0013700
Apr. 1, 2003 (KR) ............... 10-2003-0020468

(51) Int. Cl.
*H01J 1/62* (2006.01)

(52) U.S. Cl. .............. 428/690; 428/917; 313/504; 313/506

(58) Field of Classification Search .......... 428/690, 428/917; 313/504, 506, 112; 252/301.16
See application file for complete search history.

(56) References Cited

U.S. PATENT DOCUMENTS

| | | | | |
|---|---|---|---|---|
| 5,503,910 | A * | 4/1996 | Matsuura et al. | 428/690 |
| 5,759,444 | A * | 6/1998 | Enokida et al. | 252/301.16 |
| 5,935,721 | A * | 8/1999 | Shi et al. | 428/690 |
| 5,972,247 | A * | 10/1999 | Shi et al. | 252/583 |
| 6,465,115 | B2 * | 10/2002 | Shi et al. | 428/690 |
| 6,534,199 | B1 * | 3/2003 | Hosokawa et al. | 428/690 |
| 2005/0064233 | A1 * | 3/2005 | Matsuura et al. | 428/690 |
| 2005/0123787 | A1 * | 6/2005 | Robello et al. | 428/690 |

FOREIGN PATENT DOCUMENTS

| | | |
|---|---|---|
| JP | 03-162485 | 7/1991 |
| JP | 06-116552 | 4/1994 |
| JP | 08-199162 | 8/1996 |
| JP | 10-072579 | 3/1998 |
| JP | 11-228951 | 8/1999 |
| JP | 2004-530527 | 10/2004 |
| KR | 10-0204220 | 4/1997 |
| WO | WO 02/38524 A1 | 5/2002 |

OTHER PUBLICATIONS

International Search Report Dated Aug. 31, 2004.
Office Action issued by the Korean Intellectual Property Office dated Mar. 25, 2005.
Japanese Office Action dated Feb. 21, 2007.

* cited by examiner

*Primary Examiner*—D. Lawrence Tarazano
*Assistant Examiner*—Camie S Thompson
(74) *Attorney, Agent, or Firm*—Holland & Knight LLP

(57) ABSTRACT

Disclosed is an organic electroluminescent device including a substrate, a first and second electrode formed on the substrate, and a light-emitting layer formed between the first electrode and the second electrode. The light-emitting layer includes a plurality of materials which is a green luminescent material using a following chemical formula as a dopant.

[Chemical formula 1]

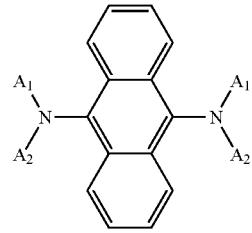

In this case, at least one of $A_1$ and $A_2$ is selected from a substituted or non-substituted aromatic group, a heterocyclic group, an aliphatic group, and hydrogen.

9 Claims, No Drawings

ORGANIC ELECTROLUMINESCENT DEVICE

CROSS-REFERENCE TO RELATED APPLICATIONS

This application claims the benefit of Korean Application Nos. P10-2003-20468, filed on Apr. 1, 2003 and P10-2003-13700 filed on Mar. 5, 2003, which are hereby incorporated by reference as if fully set forth herein.

BACKGROUND OF THE INVENTION

1. Field of the Invention

The present invention relates to an organic eletroluminescent device, and more particularly, a green luminescent material of a luminescent layer.

2. Discussion of the Related Art

Recently, with the trend of a large sized display, a request of a flat display that occupies a small area has been increased. One example of the flat display is an organic electroluminescent device also called as an organic light emitting diode (OLED). And, technology for the organic electroluminescent display is developed rapidly, whereby various prototypes have been in market already.

The organic electroluminescent device emits light in a manner that electric charges are injected in an organic layer formed between an anode and a cathode so as to form a pair of electron and hole to generate an exciton and an excited state of the exciton falls to a ground state so as to emit light.

The organic electroluminescent device is not only formed on a flexible transparent substrate such as a plastic but also operated at a lower voltage (less than 10V) compared to a plasma display panel or an inorganic electroluminescent display.

Also, the organic electroluminescent device has advantages in that power consumption is reduced and various colors are available.

Moreover, the organic electroluminescent device enables to express three colors including green, blue, and red. Therefore, many concerns are focused on the organic electroluminescent device as the next generation full color display.

The organic electroluminescent device may be realized to emit blue, green, or red light in accordance with a material forming the luminescent layer.

Particularly, the light-emitting layer for green luminescence is fabricated by doping a dopant to a host material.

Perylene, coumarine, pyrene, anthracene, and a complexing agent such as $Alq_3$, that is derivatives thereof are normally used.

However, it is a biggest problem in realizing green luminescence of the organic electroluminescent device that a degree of color purity and the luminescence efficiency are lowered.

The conventional green luminescent materials had problems of emitting light with a long wavelength during emission of light and of lowering the degree of color purity and the luminescence efficiency more at higher doping density.

SUMMARY OF THE INVENTION

Accordingly, the present invention is directed to an organic electroluminescent device that substantially obviates one or more problems due to limitations and disadvantages of the related art.

An object of the present invention is to provide an organic electroluminescent device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic luminescent device according to the present invention includes a substrate; a first and second electrodes formed on the substrate; a light-emitting layer formed between the first electrode and the second electrode, the light-emitting layer having a plurality of materials and being a green luminescent material using a chemical formula 1 as a dopant.

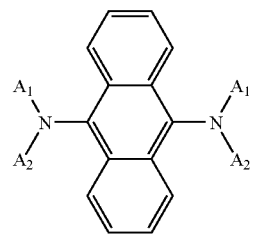

[Chemical formula 1]

In this case, at least one of $A_1$ and $A_2$ is selected from a substituted or non-substituted aromatic group, a heterocyclic group, an aliphatic group, and hydrogen.

Wt. % of the material in the chemical formula 1 is 0.1-49.9 wt. % of a total weight of the luminescent layer.

Material forming the light-emitting layer together with the material of the chemical formula 1 is formed as a structure of a following chemical formula 2.

B1-X-B2  [Chemical formula 2]

Wherein, X is fused Aromatic compounds and at least one of B1 and B2 is selected from a group consisting of aryl, alkylaryl, alkoxyaryl, arylaminoaryl, alkylamino, and arylallyl.

X is one selected from a group consisting of naphthalene, fluorene anthracene, phenanthrene, pyrene, perylene, quinoline, and isoquinoline.

At least one of the B1 and B2 is selected from phenyl, biphenyl, pyridyl, naphthyl, tritylphenyl, biphenylenyl, anthryl, phenanthryl, pyrenyl, perylenyl, quinolyl, isoquinolyl, fluorenyl, terphenyl, tolyl, xylyl, methylnaphthyl, and hydrogen.

At least one of the A1 and A2 is selected from phenyl, biphenyl, pyridyl, naphthyl, quinolyl, isoquinolyl, fluorenyl, terphenyl, methyl, ethyl, propyl, i-propyl, and t-buthyl.

The substituent of each substituted A1 and A2 is at least one and selected from alkyl, aryl, alkoxy, alkylamino, halogen, aryloxy, arylamino, alkylsilyl, arylsilyl and hydrogen.

The substituent is one selected from methyl, ethyl, propyl, i-propyl, t-butyl, cyclohexyl, methoxy, ethoxy, propoxy, butoxy, dimethylamino, trimethylsilyl, fluorine, chroline, phenoxy, tolyloxy, dimethylamino, diethylamino, diphenylamino, and triphenylsilyl.

It is to be understood that both the foregoing general description and the following detailed description of the present invention are exemplary and explanatory and are intended to provide further explanation of the invention as claimed.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the present invention, the light-emitting layer formed between a first electrode and a second electrode includes a plurality of materials and a green material using a following chemical formula as a dopant.

[Chemical formula 1]

In this case, at least one of $A_1$ and $A_2$ is selected from a substituted or non-substituted aromatic group, a heterocyclic group, an aliphatic group, and hydrogen.

Wt. % of the material in the chemical formula 1 is 0.1-49.9 wt. % of a total weight of the luminescent layer.

Materials forming the light-emitting layer together with the material of the chemical formula 1 is structured as a chemical formula 2.

B1-X-B2            [Chemical formula 2]

In this case, the X is selected from fused aromatic compounds, particularly from a group consisting of naphthalene, fluorene, anthracene, phenanthrene, pyrene, perylene, quinoline, and isoquinoline.

Also, at least one of the B1 and B2 may be selected from a group consisting of aryl, alkylaryl, alkoxyaryl, arylaminoaryl, alkylamino, and arylallyl, particularly from phenyl, biphenyl, pyridyl, naphthyl, tritylphenyl, biphenylenyl, anthryl, phenanthryl, pyrenyl, perylenyl, quinolyl, isoquinolyl, fluorenyl, terphenyl, tolyl, xylyl, methylnaphthyl, and hydrogen.

In this case, the material forming the light-emitting layer together with the chemical formula 1 is one of following chemical formulas.

H-1

H-2

H-3

H-4

-continued
H-5
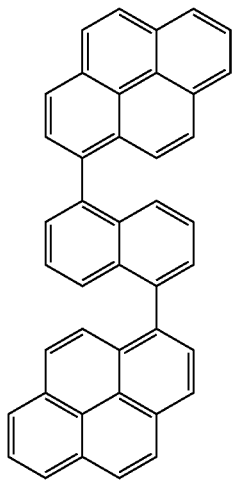
H-6
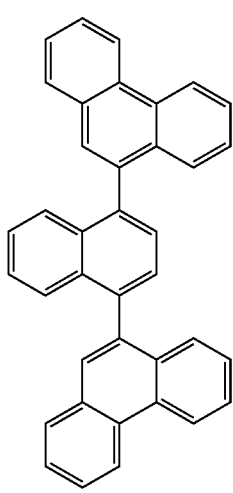
H-7
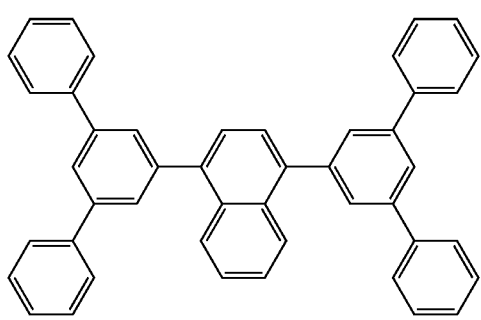
H-8
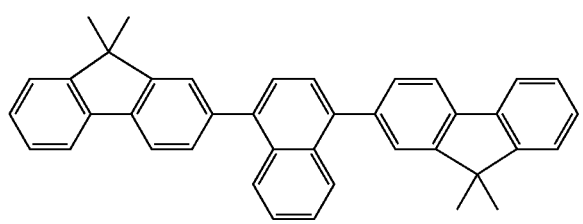
-continued
H-9
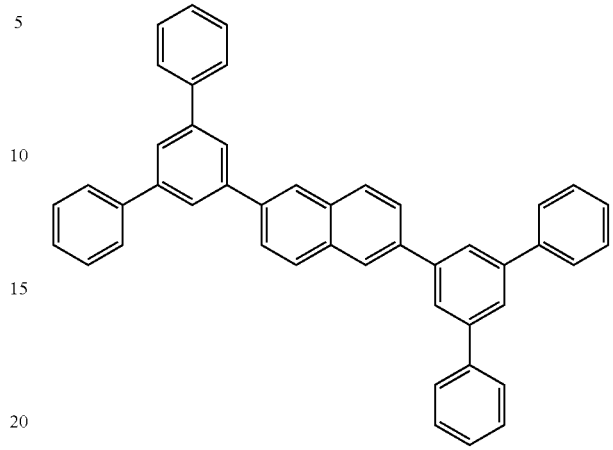
H-10
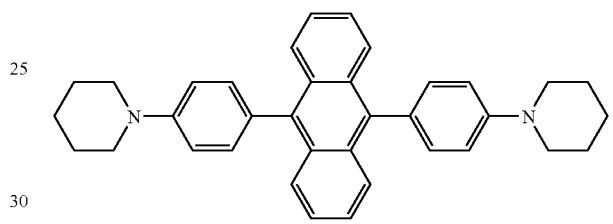
H-11
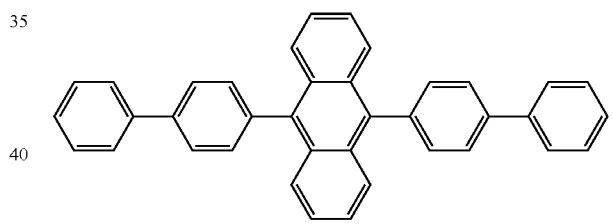
H-12
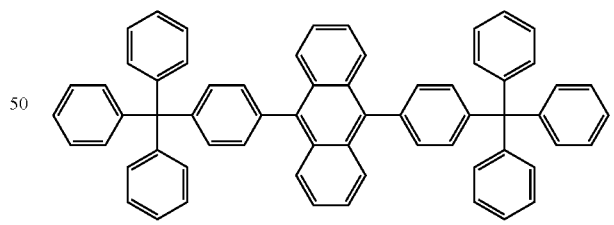
H-13
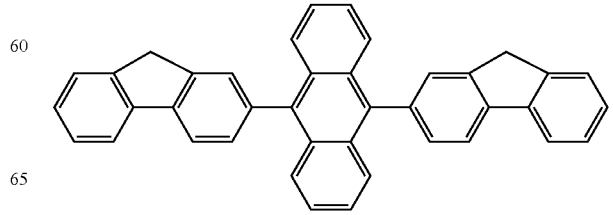

-continued
H-14
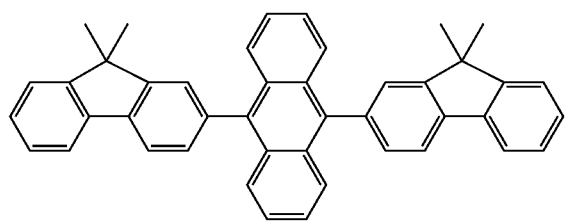
H-15
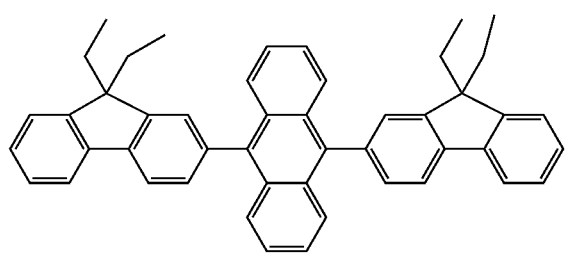
H-16
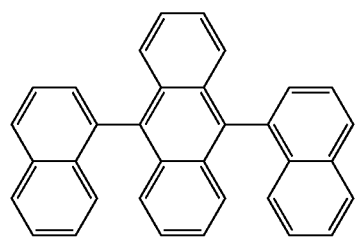
H-17
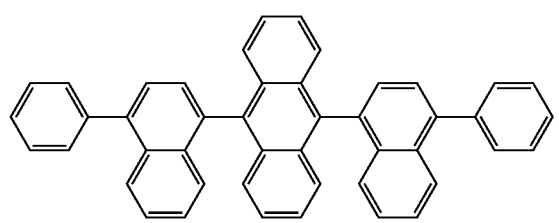
H-18
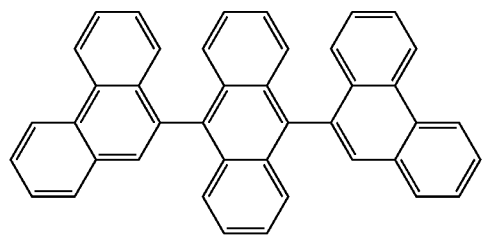
-continued
H-19
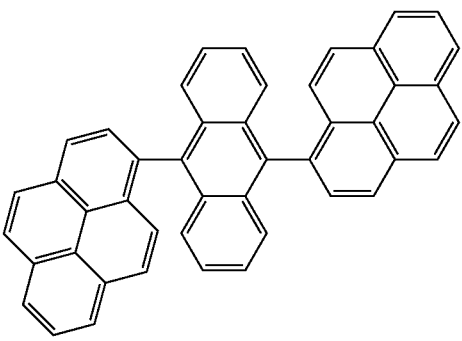
H-20
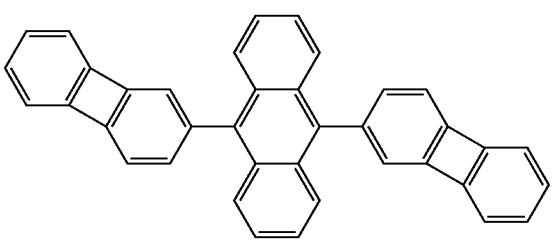
H-21
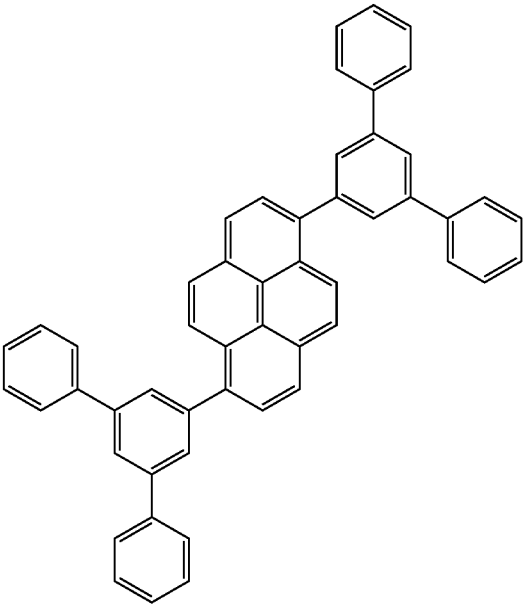
H-22
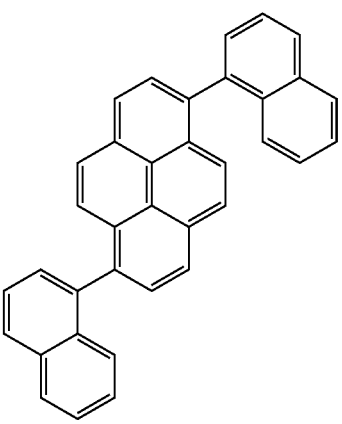

-continued
H-23
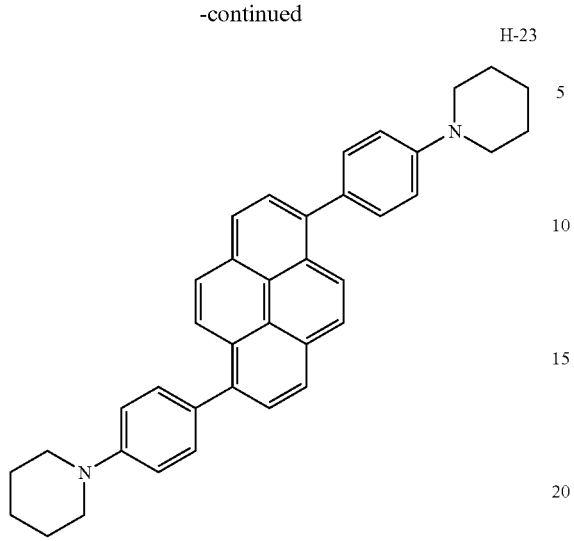
H-24
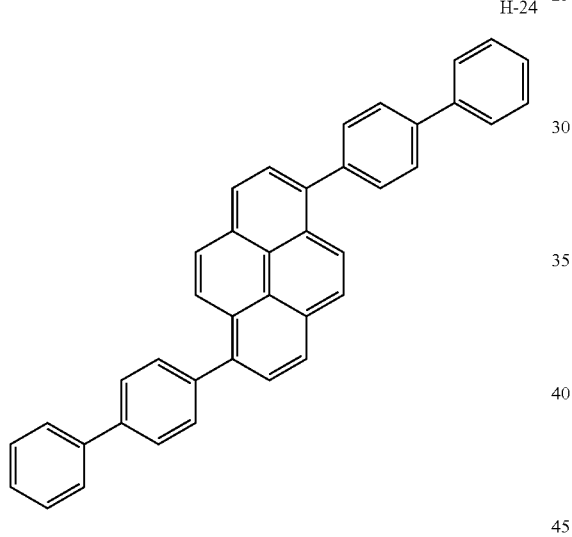
H-25
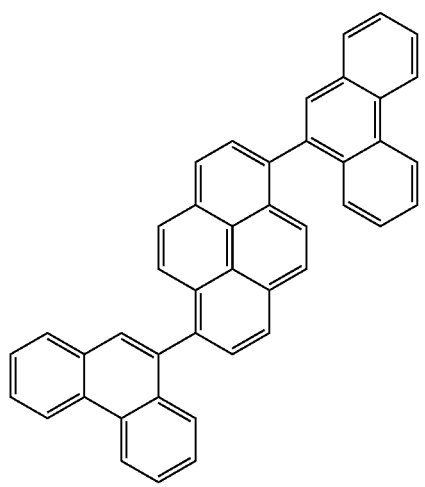
-continued
H-26
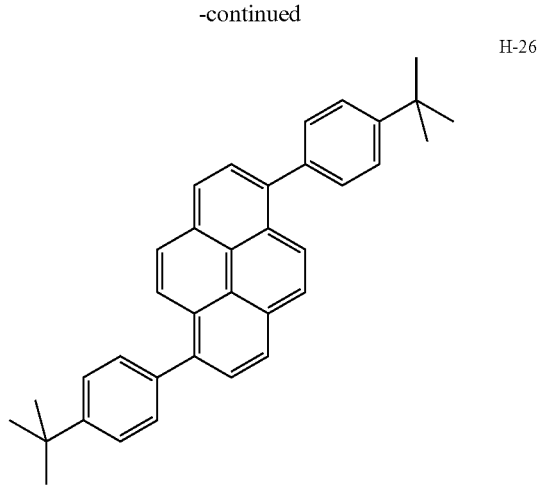
H-27
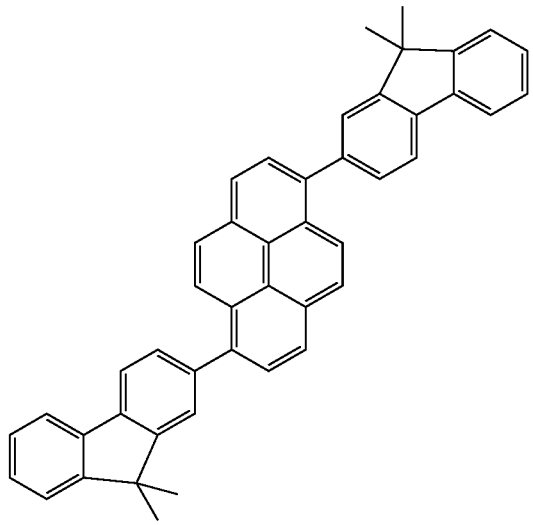
H-28
H-29
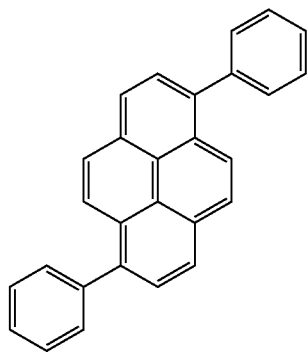

-continued

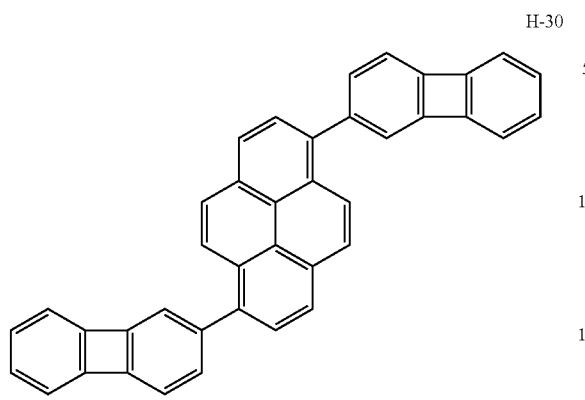
H-30

Also, in a case of the chemical formula 1, at least one of the A1 and A2 may be selected from a substituted or non-substituted aromatic group, a heterocyclic group, an aliphatic group, and hydrogen.

Particularly, at least one of A1 and A2 may be selected from phenyl, biphenyl, pyridyl, naphthyl, quinolyl, isoquinolyl, fluorenyl, terphenyl, methyl, ethyl, propyl, i-propyl, and t-buthyl.

In this case, each substitute of the substituted A1 and A2 is at lest one and selected from alkyl, aryl, alkoxy, alkylamino, halogen, aryloxy, arylamino, alkylsilyl, arylsilyl, and hydrogen.

For example, a substituent of the A1 and A2 may be selected from methyl, ethyl, propyl, i-propyl, t-butyl, cyclohexyl, methoxy, ethoxy, propoxy, butoxy, dimethylamino, trimethylsilyl, fluorine, chlorine, phenoxy, tolyloxy, dimethylamino, diethylamino, diphenylamino, and triphenylsilyl.

Particularly, at least one of the substituted or non-substituted A1 and A2 may be one of the following chemical formulas and the substituent of A1 and A2 is selected from a functional group having a following structural formula.

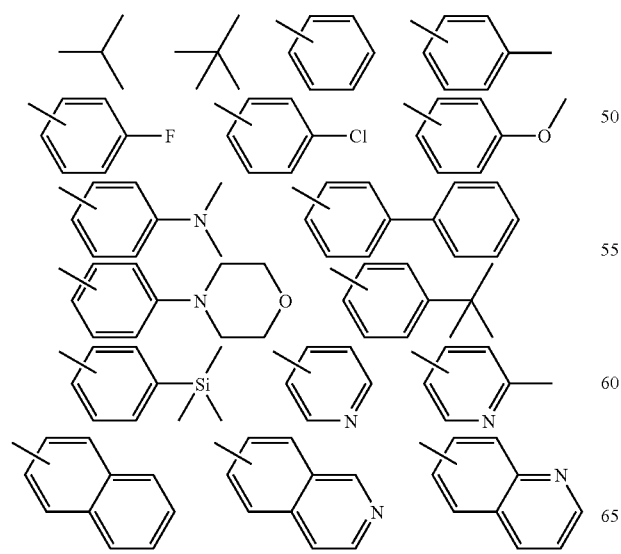

-continued

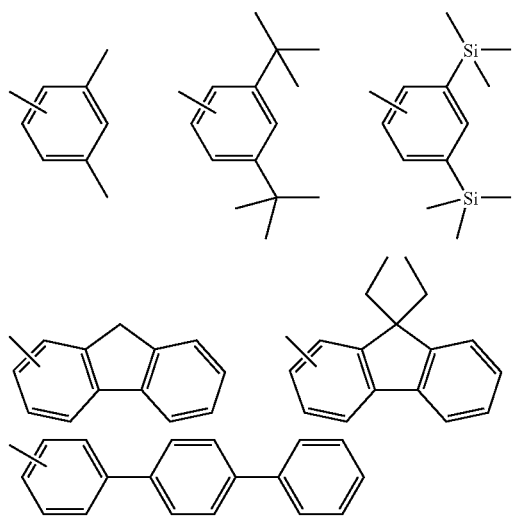

The green luminescent material may be at least one of the following chemical formulas.

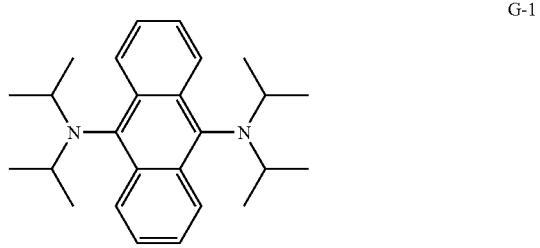
G-1

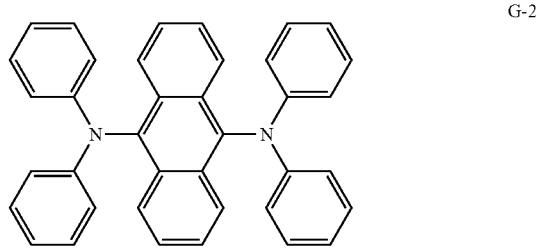
G-2

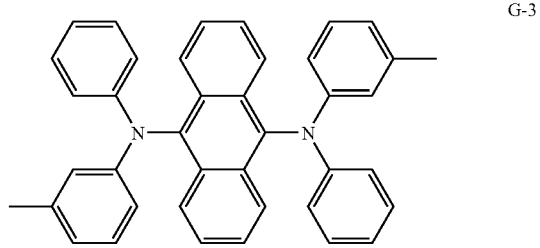
G-3

-continued
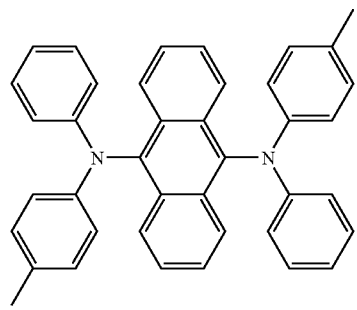
G-4
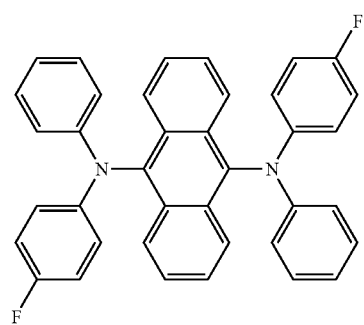
G-5
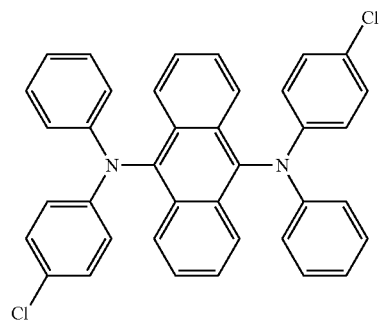
G-6
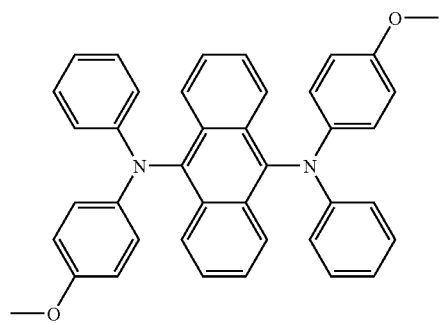
G-7
-continued
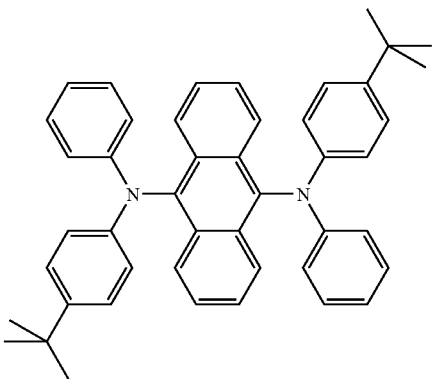
G-8
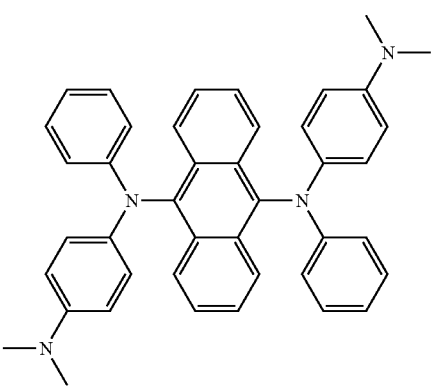
G-9
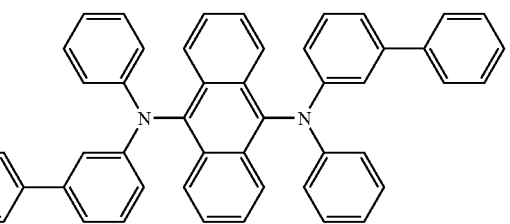
G-10
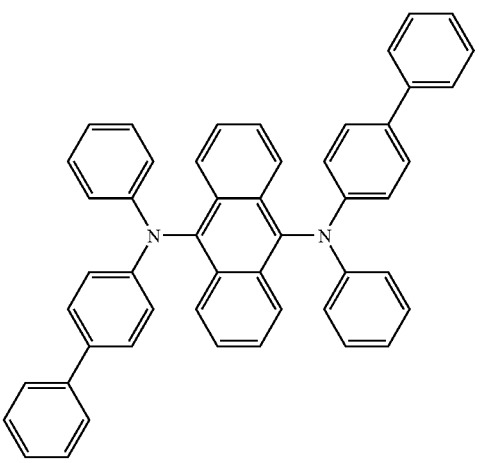
G-11

G-12
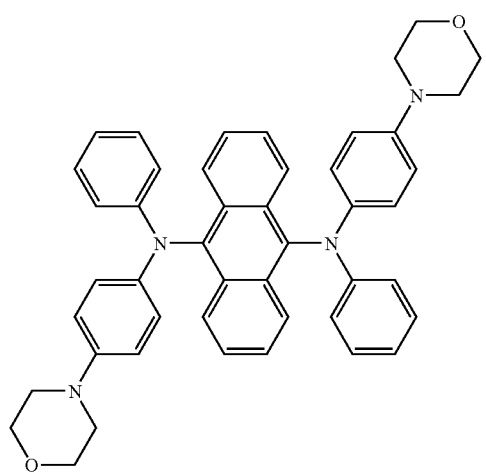
G-13
G-14
G-15
G-16
G-17
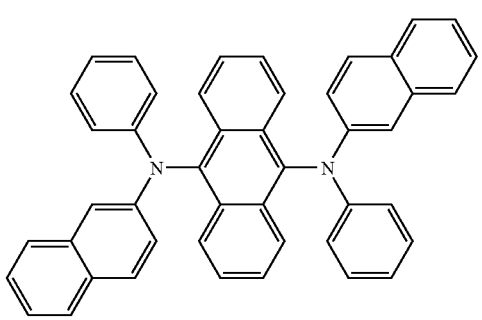
G-18
G-19
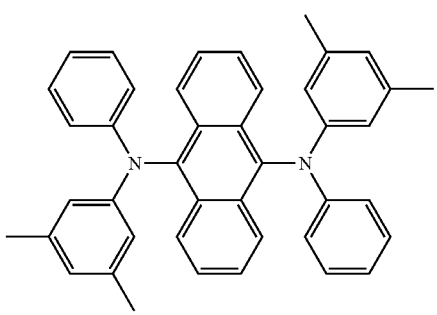
G-20
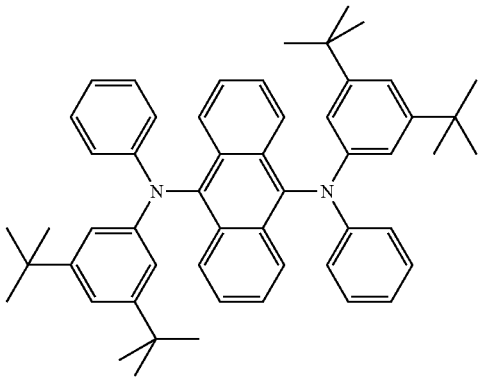

-continued
G-21
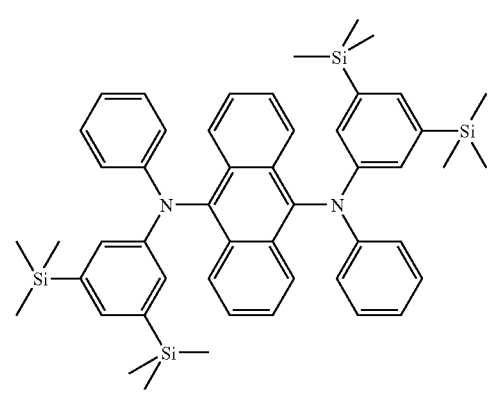
G-22
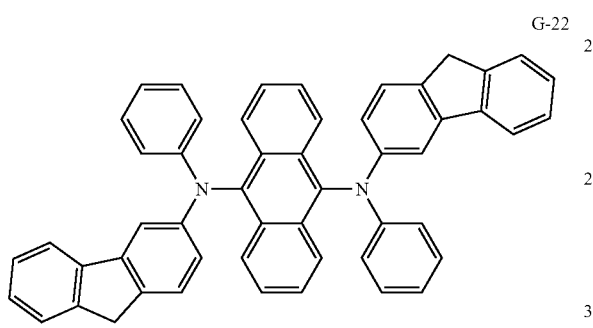
G-23
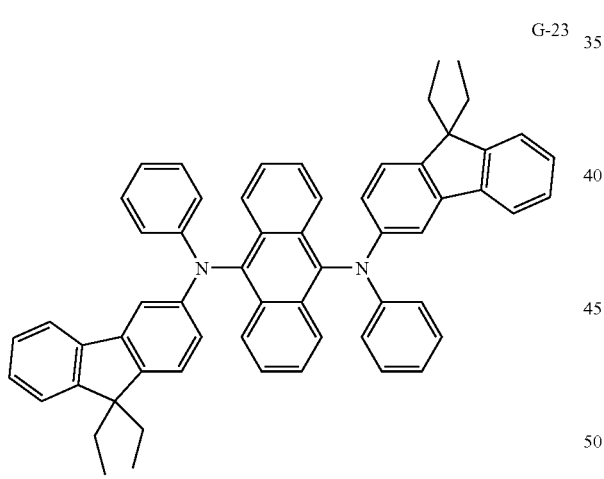
G-24
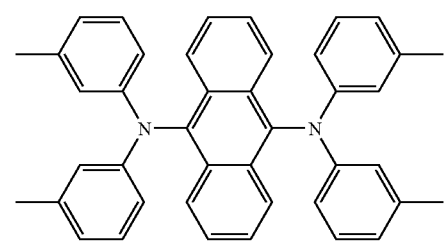
-continued
G-25
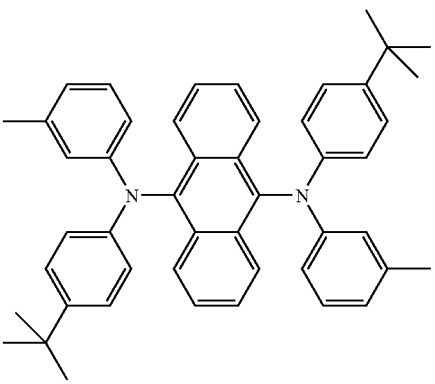
G-26
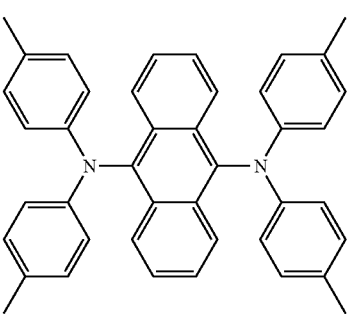
G-27
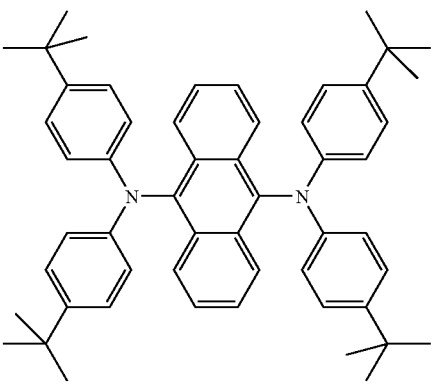
G-28
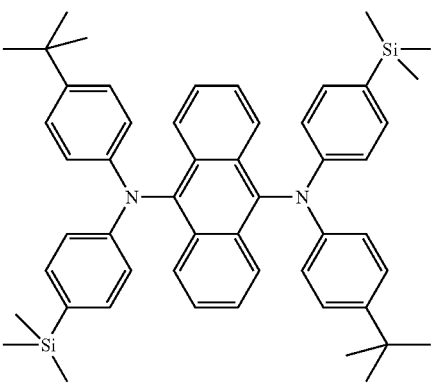

-continued
G-29
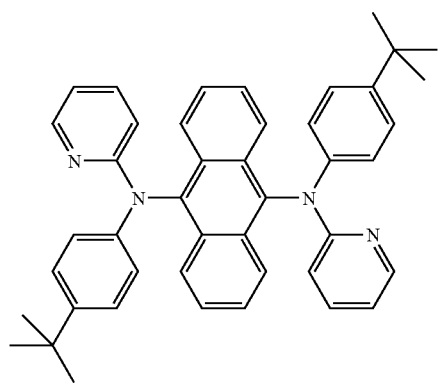
G-30
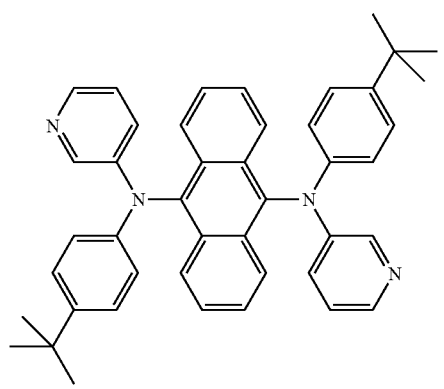
G-31
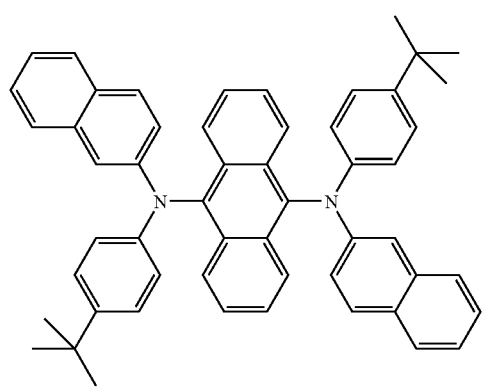
G-32
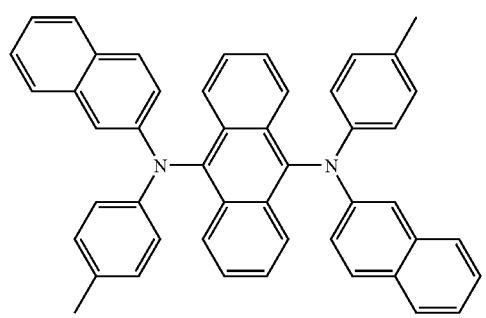
-continued
G-33
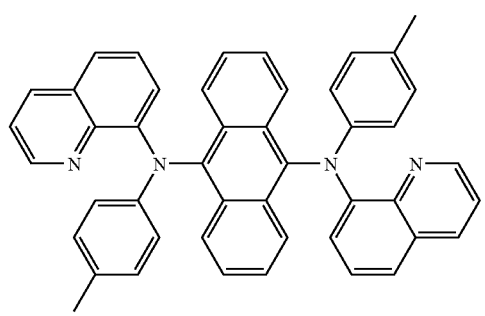
G-34
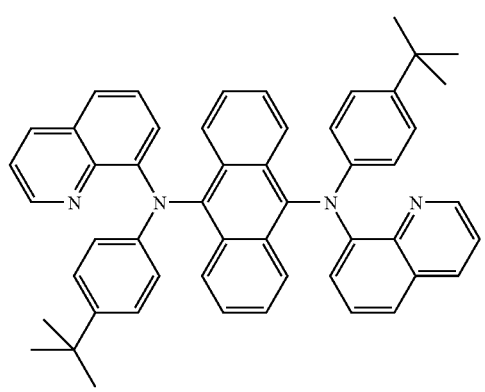
G-35
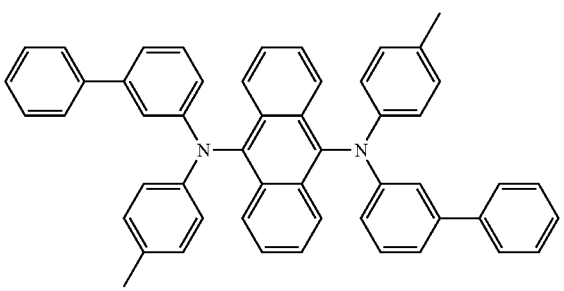
G-36
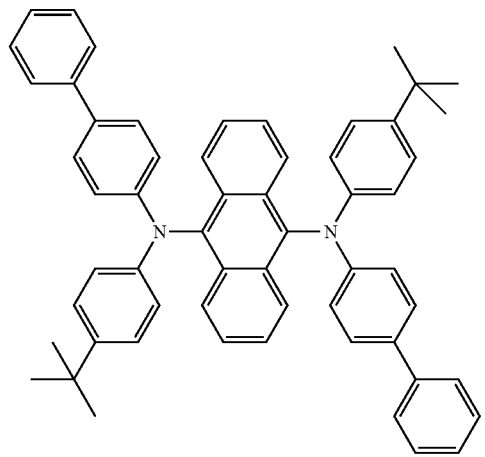

G-37
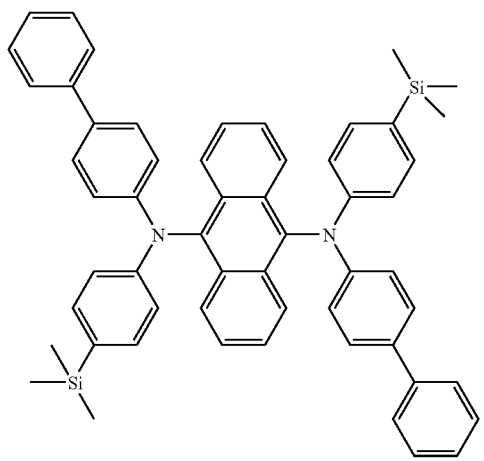
G-38
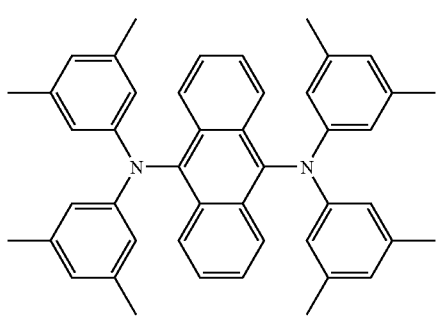
G-39
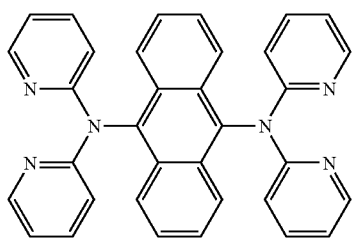
S-40
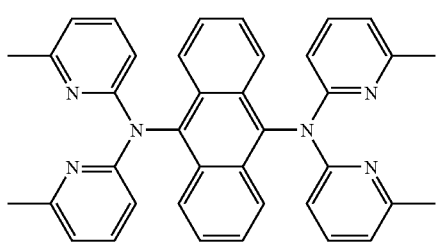
G-41
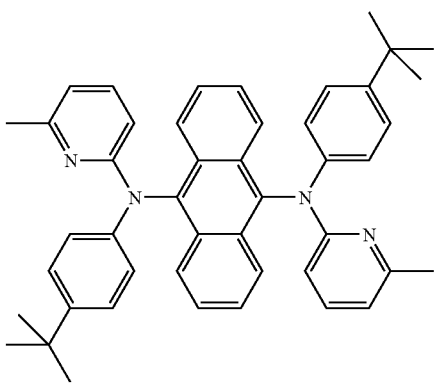
G-42
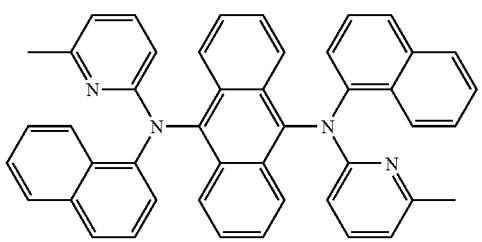
G-43
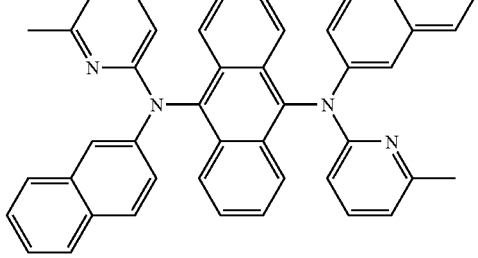
According to the organic luminescent device of the present invention, N,N'-Di-naphthalen-2-yl-N,N'-di-p-tolyl-anthracene-9,10-diamine used as the green luminescent material is compounded as follows.
(1) Synthesis of N,N,N',N'-Tetraphenyl-anthracene-9,10-diamine
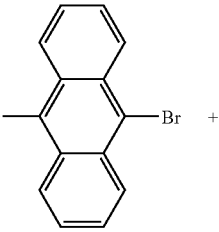
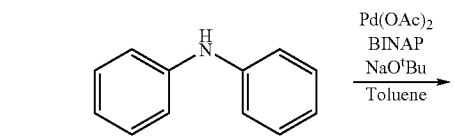

-continued

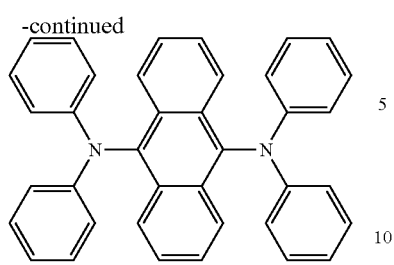

First, 3 g(0.0089 mol) of 9,10-dibrmoanthracene, 3.78 g (0.022 mol) of diphenylamine, 0.055 g (1% mol) of BINAP [(2.2'-Bis(diphenylphosphino)-1,1'-binaphthyl)], 0.02 g (1% mol), Pd (OAc)$_2$[Pd(II)acetate], (3.4 g, 0.036 mol) of NaO$^t$Bu (Sodium tert-butoxide), and 100 ml of toluene are admitted into a 2-necks-r.b.f. so as to be refluxed for 24 hours.

When the reaction is finished, the 2-necks-r.b.f. is cooled at a normal temperature and about 60 ml of toluene which is a reaction solvent is removed by distillation under reduced pressure.

When methanol (100 ml) is added to the solution from which toluene 40 ml is removed, precipitate is obtained. And, the precipitate is filtered, whereby a yellow solid matter of N,N,N',N'-Tetraphenyl-anthracene-9,10-diamine is obtained.

(2) Synthesis of N,N'-Diphenyl-N,N'-di-m-tolyl-anthracene-9,10-diamine

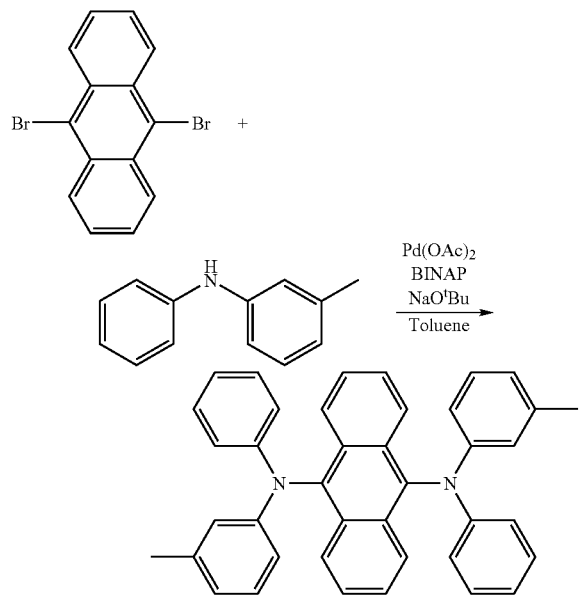

First, 3 g(0.0089 mol) of 9,10-dibrmoanthracene, 5.21 g (0.022 mol) of phenyl-m-tolyl-amine, 0.052 g (1% mol) of BINAP, 0.02 g (1% mol) of Pd (OAc)$_2$ and 3.4 g (0.036 mol) of NaO$^t$Bu, and 100 ml of toluene are admitted into a 2-necks-r.b.f. so as to be refluxed for 24 hours.

When the reaction is finished, the 2-necks-r.b.f. is cooled at a normal temperature and about 60 ml of toluene which is a reaction solvent is removed by distillation under reduced pressure.

A resulted solution is extracted from a crude product from which toluene is removed using water and methanol (100 ml). Methylene chloride layer is separated and removed from the resulted solution using MgSO$_4$ so as to remove methylene chloride by distillation under reduced pressure.

And, methanol is added thereto so as to clean the solid matter obtained by removing methylene chloride. And, the solid matter is filtered, whereby a yellow solid matter of N,N'-Diphenyl-N,N'-di-m-tolyl-anthracene-9,10-diamine is obtained.

(3) Synthesis of N,N'-Di-naphthalen-2-yl-N,N'-di-p-tolyl-anthracene-9,10-diamine

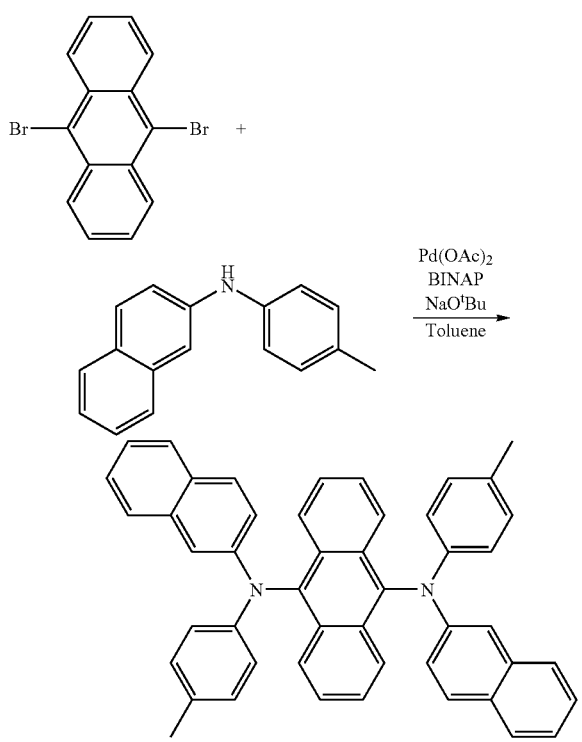

First, 3 g(0.0089 mol) of 9,10-dibrmoanthracene, 5.21 g (0.022 mol) of Naphthalene-2-nyl-p-tolyl-amine, 0.052 g (1% mol) of BINAP, 0.02 g (1% mol) of Pd (OAc)$_2$ and 3.4 g (0.036 mol) of NaO$^t$Bu, and 100 ml of toluene are admitted into a 2-necks-r.b.f. so as to be refluxed for 24 hours.

When the reaction is finished, the 2-necks-r.b.f. is cooled at a normal temperature and about 60 ml of toluene which is a reaction solvent is removed by distillation under reduced pressure.

A resulted solution is extracted from a crude product from which toluene is removed using water and methanol (100 ml). Methylene chloride layer is separated and removed from the resulted solution using MgSO$_4$ so as to remove methylene chloride by distillation under reduced pressure.

Methanol is added thereto so as to clean a solid matter obtained by removing methylene chloride. And, the solid matter is filtered, whereby a yellow solid matter of N,N'-Diphenyl-N,N'-di-m-tolyl-anthracene-9,10-diamine is obtained.

Hereinafter, preferred embodiments of the organic electroluminescent device will be described in accordance with the present invention.

EMBODIMENT

An ITO glass is patterned so as to have a size of 3 mm×3 mm. The patterned ITO glass is then cleaned.

A substrate is loaded on a vacuum chamber of which basic pressure is set up as 1×10⁻⁶ torr and CuPC(200 Å), NPB(500 Å), a light-emitting layer (300 Å), Alq₃(500 Å), LiF(5 Å), and Al(1,000 Å) are deposited successively on the ITO in order.

In this case, a first host of the light-emitting layer includes a following material and a mixture ratio between the host and impurities is 1:0.01.

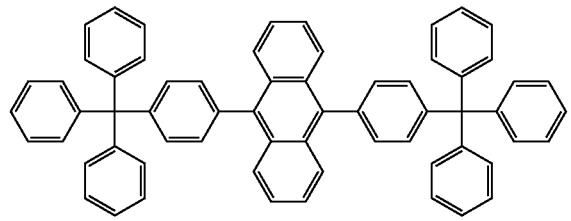

HOST-1

First Embodiment

When about 1 mA of electric current is flown by using dopant having a chemical formula of G-2, voltage is about 7.48 v and brightness shows about 1527 cd/m², whereby CIE (Commision Internationale de L'Eclairage) x=0.220, y=0.555.

Second Embodiment

When about 1 mA of electric current is flown by using dopant having a chemical formula of G-3, voltage is about 7.12 v and brightness shows about 1445 cd/m², whereby CIE x=0.254, y=0.619.

Third Embodiment

When about 1 mA of electric current is flown by using dopant having a chemical formula of G-32, voltage is about 7.74 v and brightness shows about 1441 cd/m², whereby CIE x=0.297, y=0.615.

In this case, a structural formula of CuPC, NPB, Alq₃ is as follows.

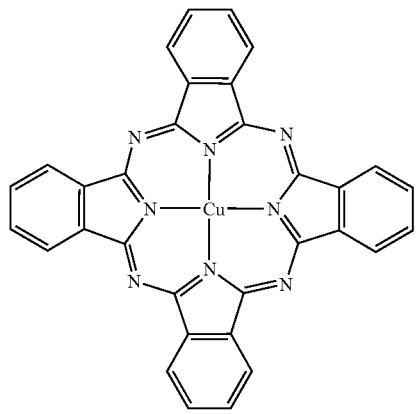

CuPC

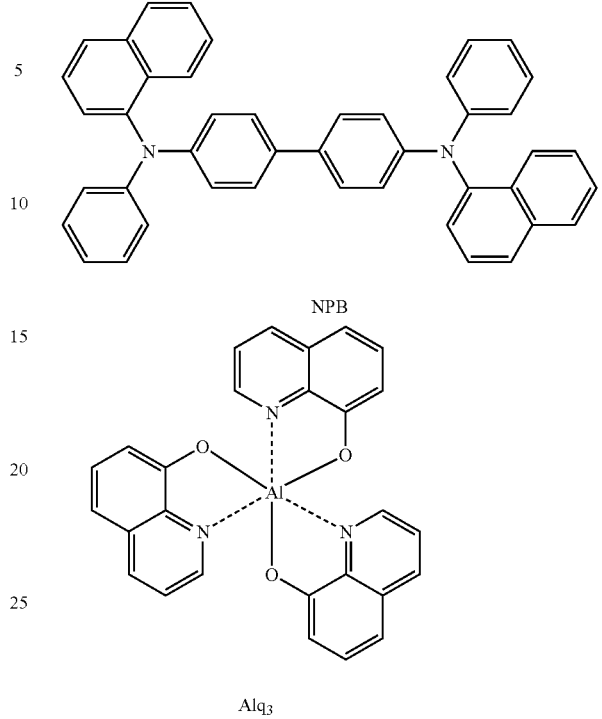

NPB

Alq₃

Accordingly, the present invention is a green luminescent material and an organic electroluminescent device having green color purity and a high luminescent efficiency is obtained by using such material with high color purity according to the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device, comprising:
   a substrate;
   first and second electrodes formed on the substrate; and
   a light-emitting layer formed between the first electrode and the second electrode, the light-emitting layer containing a green luminescent material represented by using a chemical formula 1 as a dopant:

[Chemica formula 1]

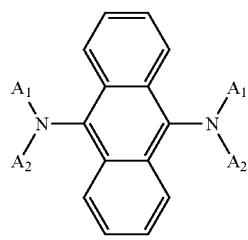

wherein, A1 and A2 are selected from a substituted or non-substituted aromatic group, a substituted or non-substituted heterocyclic group, wherein the light-emitting layer further contains a host material represented by a chemical formula 2:

B1-X-B2 [Chemical formula 2]

wherein the X is selected from the group consisting of anthracene, and pyrene and B1 and B2 are individually selected from a group consisting of aryl, pyridyl, quinolyl, and isoquinolyl; and wherein the host material is one of following formulas:

H-12

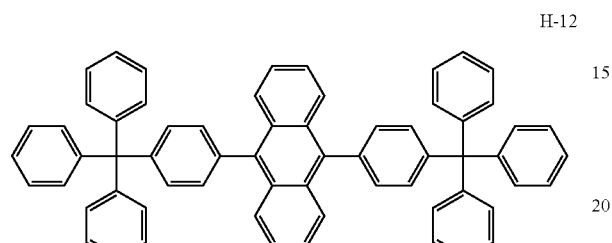

H-14

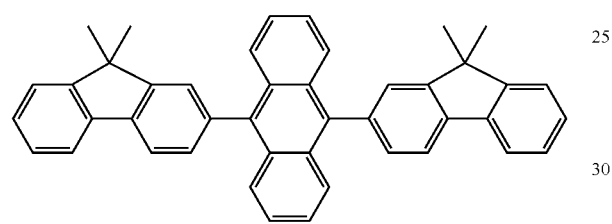

H-15

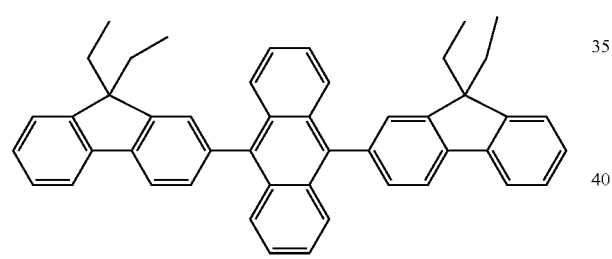

H-19

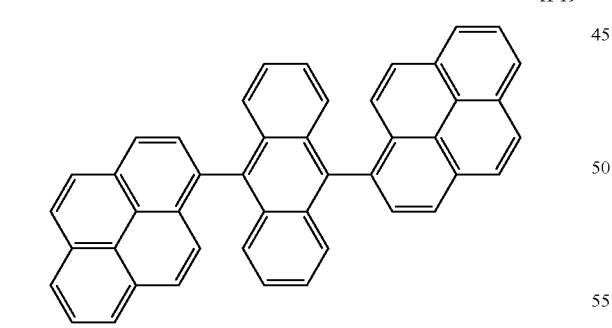

H-20

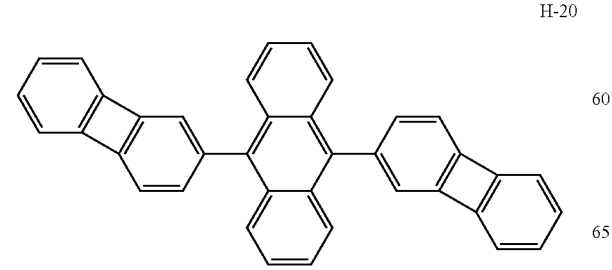

-continued

H-23

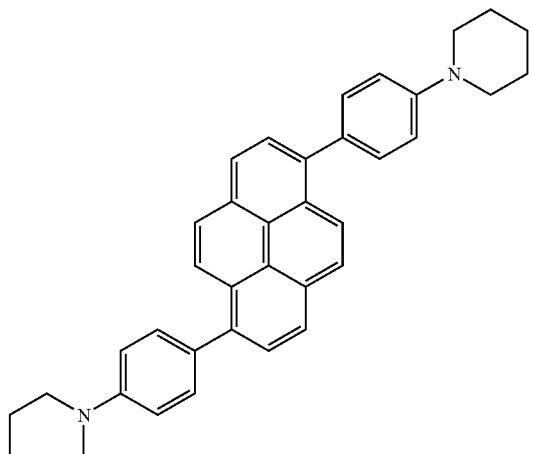

H-26

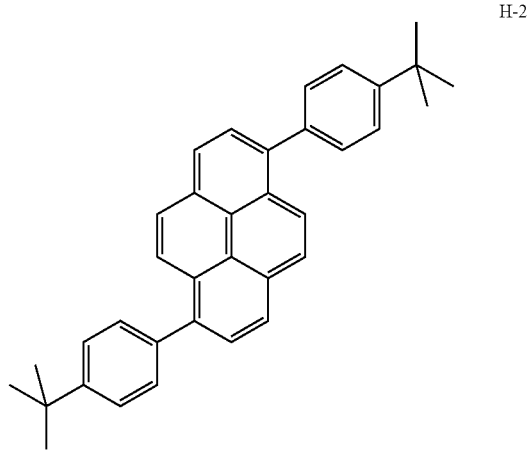

H-27

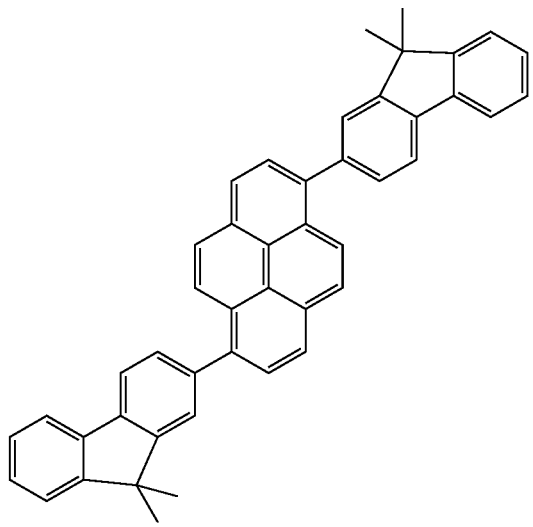

-continued

H-30

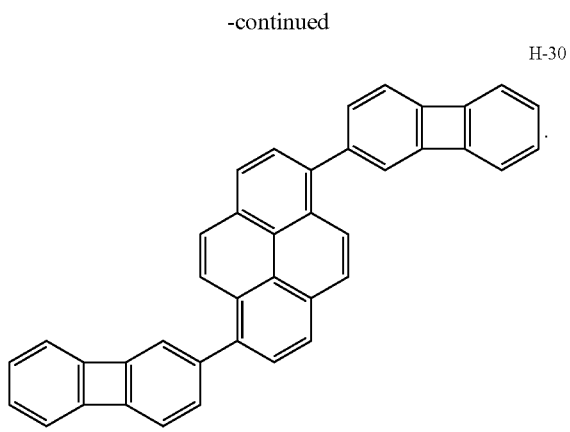

-continued

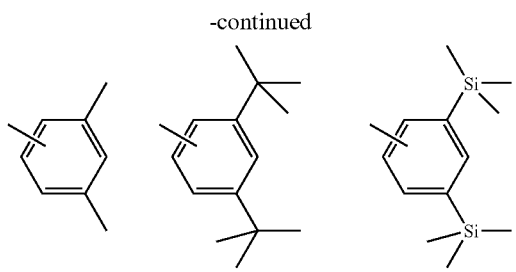

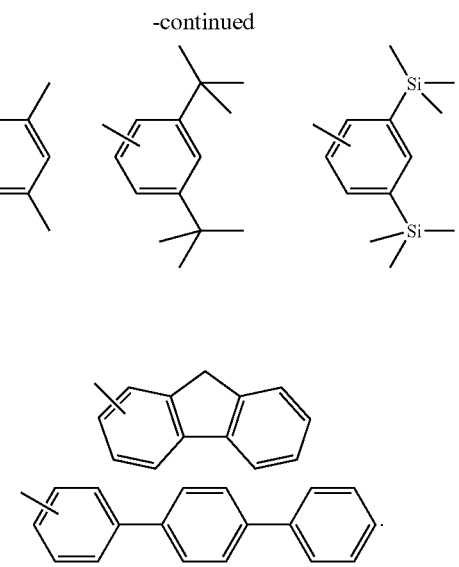

2. The organic electroluminescent device of claim 1, wherein wt. % of the material of the chemical formula 1 is 0.1-49.9 wt. % of a total weight of the light-emitting layer.

3. The organic electroluminescent device of claim 1, wherein the B1 and B2 are selected from the group consisting of pyridyl, naphthyl, phenanthryl, quinolyl, isoquinolyl, and fluorenyl.

4. The organic electroluminescent device of claim 1, wherein at least one of the A1 and A2 is selected from phenyl, biphenyl, pyridyl, naphthyl, quinolyl, isoquinolyl, fluorenyl, terphenyl, methyl, ethyl, propyl, i-propyl, and t-butyl.

5. The organic electroluminescent device of claim 1, wherein a substituent of each substituted A1 and A2 is at least one selected from the group consisting of alkyl, aryl, alkoxy, alkylamino, halogen, aryloxy, arylamino, alkylsilyl, arylsilyl and hydrogen.

6. The organic electroluminescent device of claim 5, wherein the substituent is one selected from methyl, ethyl, propyl, i-propyl, t-butyl, cyclohexyl, methoxy, ethoxy, propoxy, butoxy, dimethylamino, trimethylsilyl, fluorine, chlorine, phenoxy, tolyloxy, dimethylamino, diethylamino, diphenylamino, and triphenylsilyl.

7. The organic electroluminescentdeviceof claim 1, wherein one of the A1 and A2 is one of following chemical formulas:

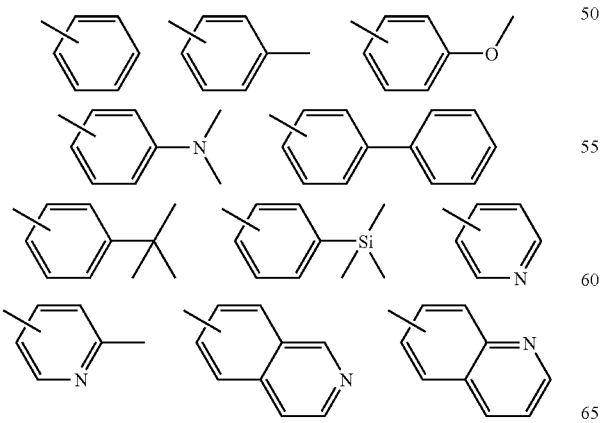

8. The organic electroluminescent device of claim 1, wherein the green luminescent material is at least one of following chemical formulas:

G-2

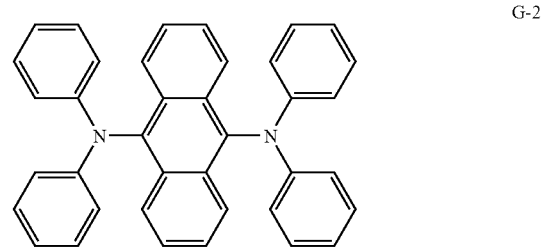

G-3

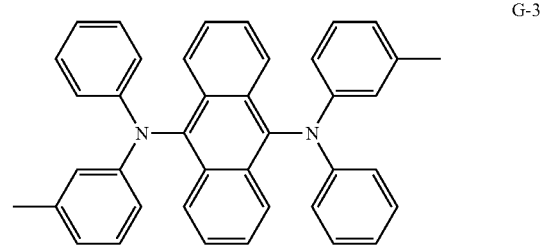

G-4

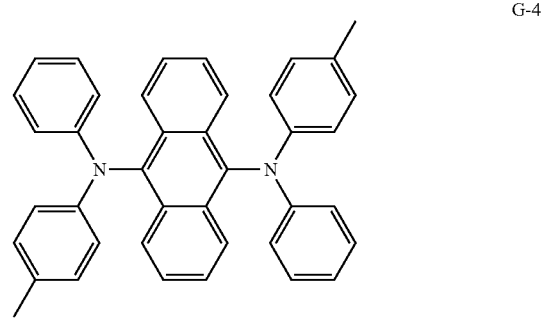

-continued
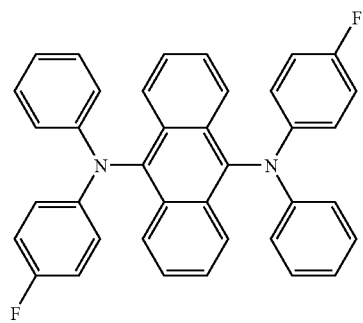
G-5
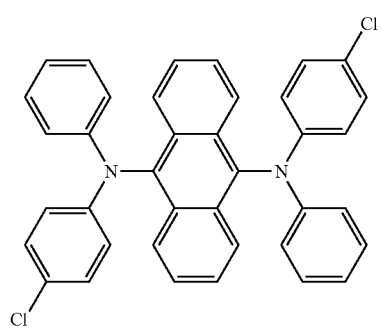
G-6
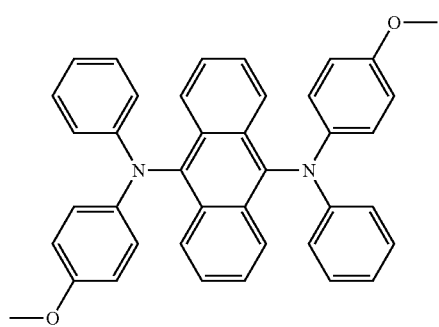
G-7
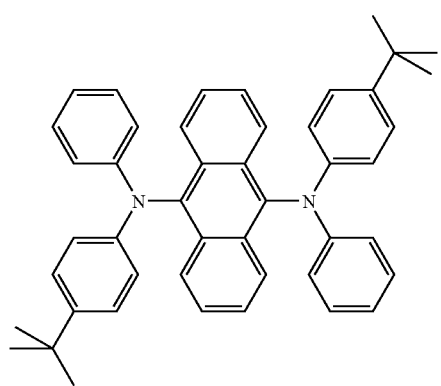
G-8
-continued
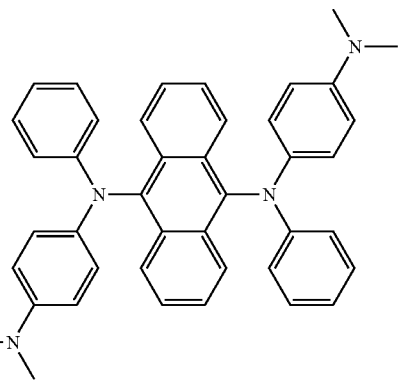
G-9
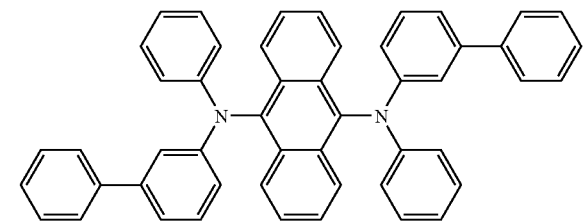
G-10
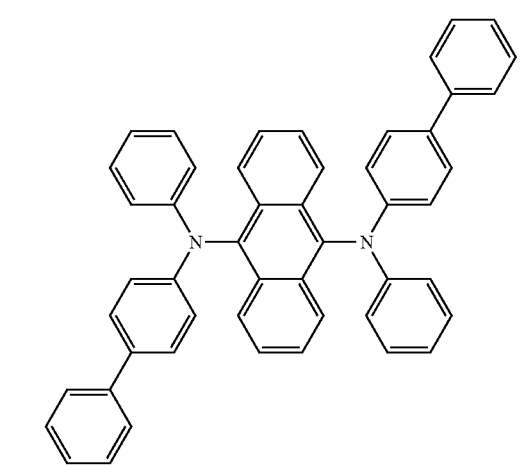
G-11
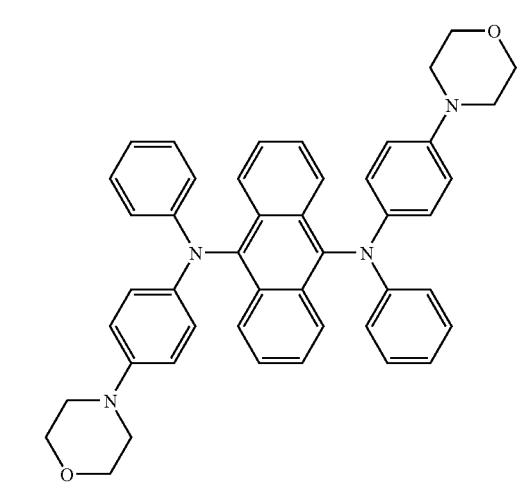
G-12

-continued
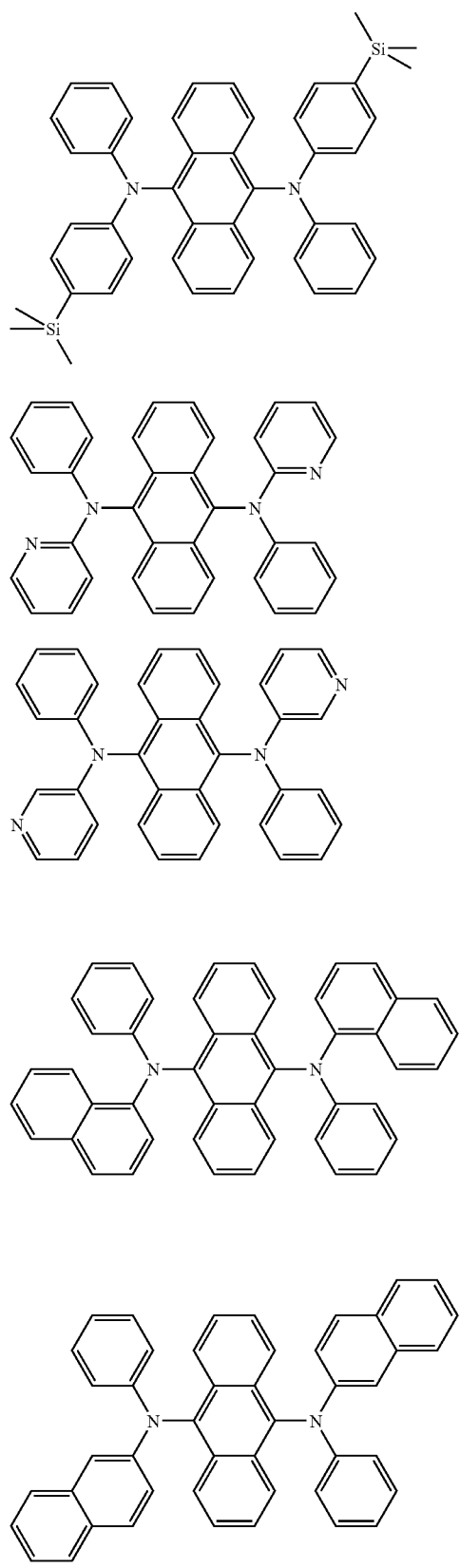
G-13
G-14
G-15
G-16
G-17
-continued
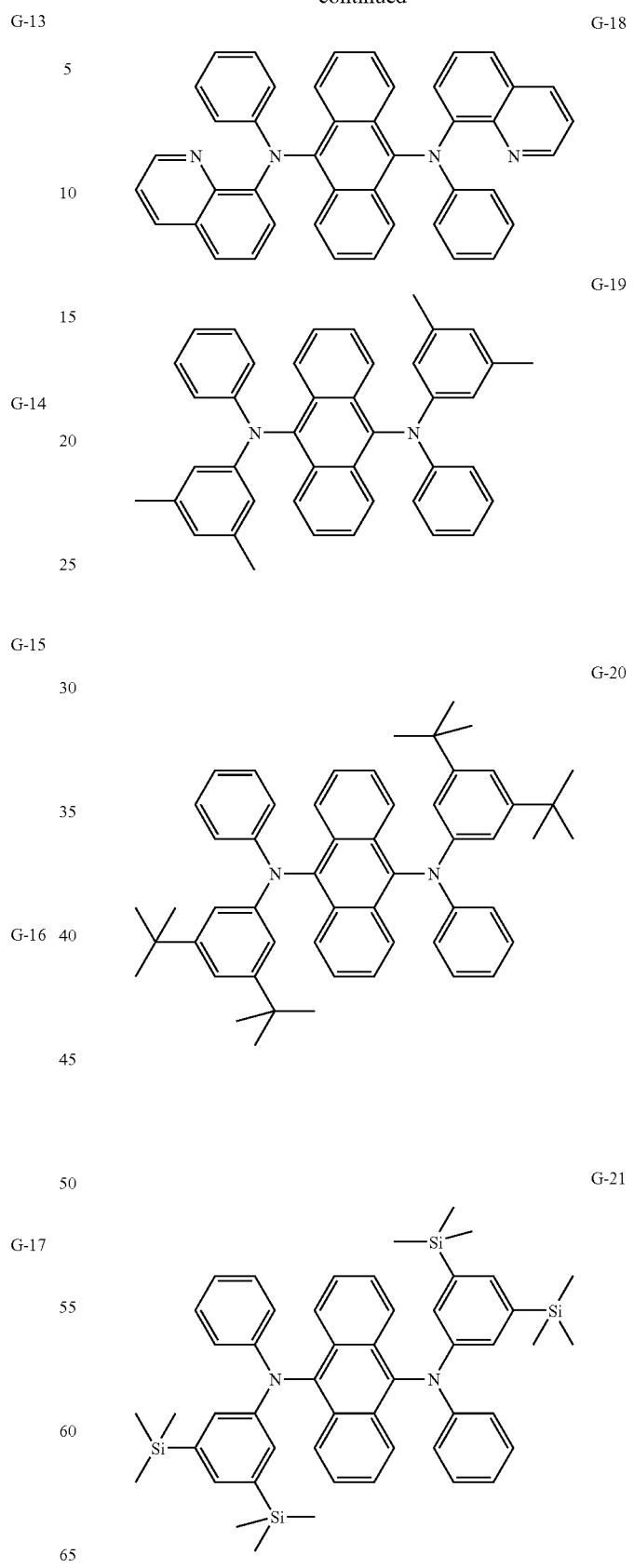
G-18
G-19
G-20
G-21

-continued
G-22
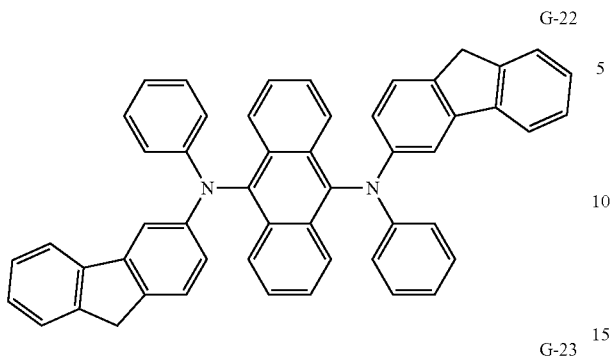
G-23
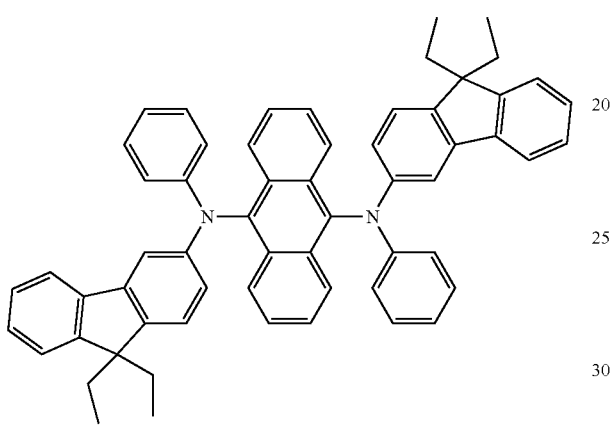
G-24
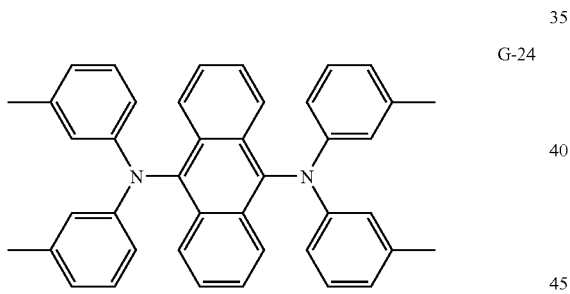
G-25
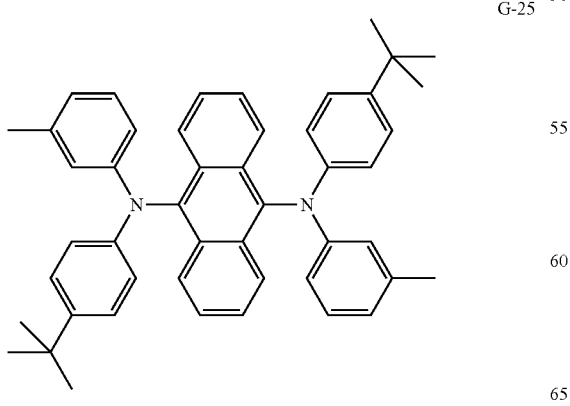
-continued
G-26
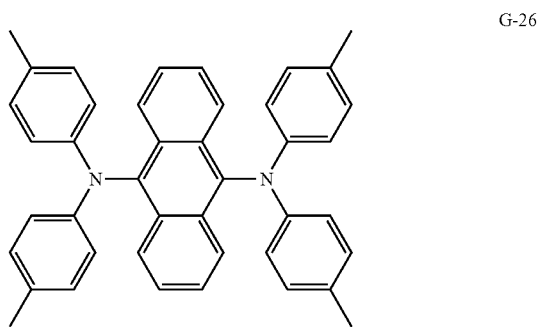
G-27
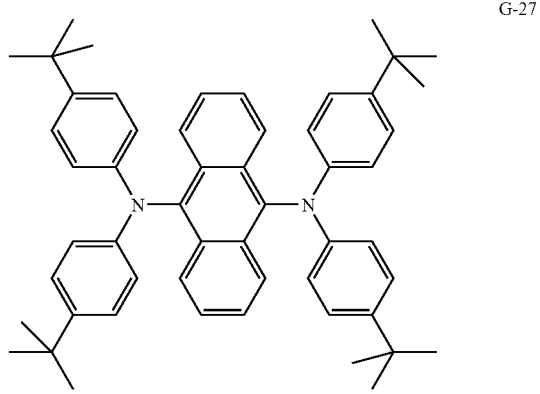
G-28
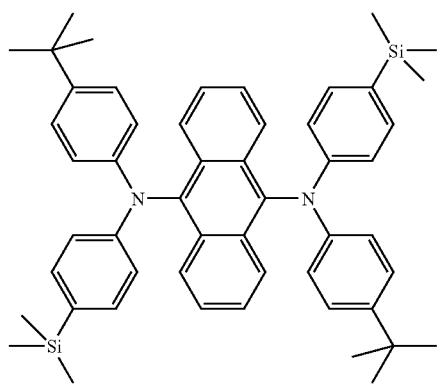
G-29
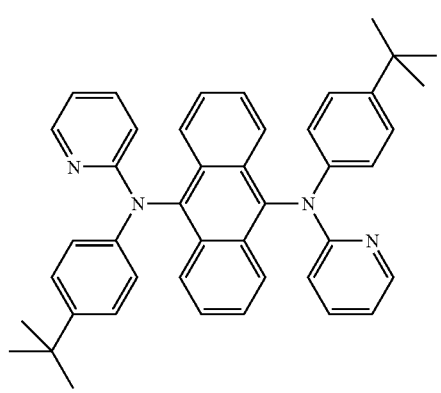

-continued
G-30
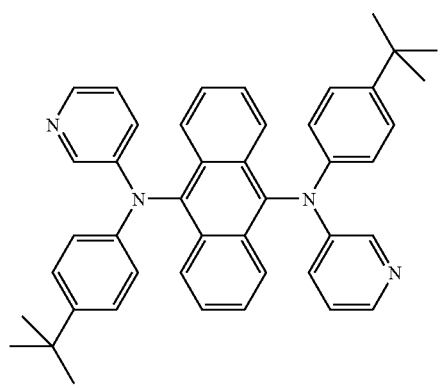
G-31
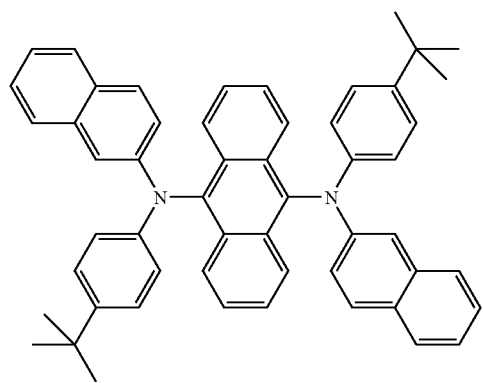
G-32
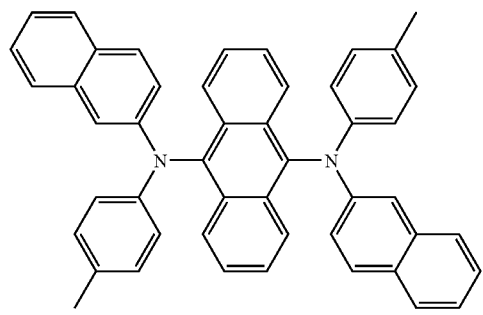
G-33
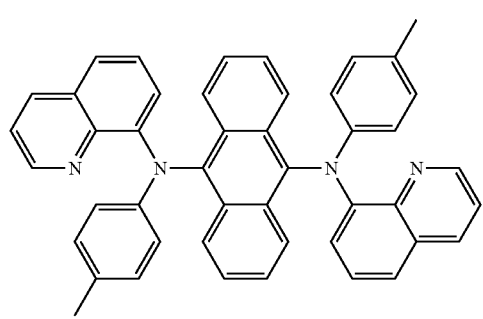
-continued
G-34
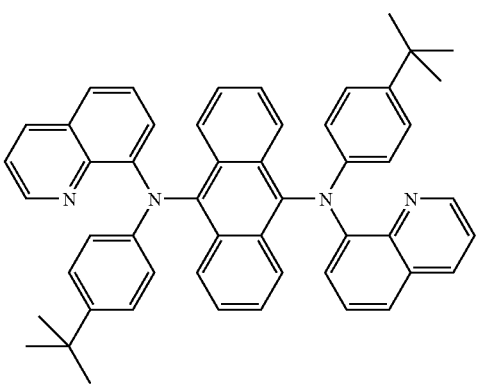
G-35
G-36
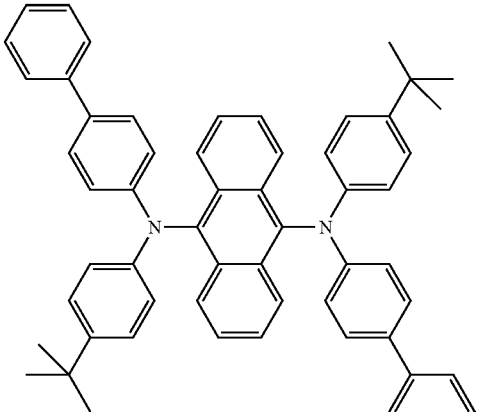

-continued

G-37
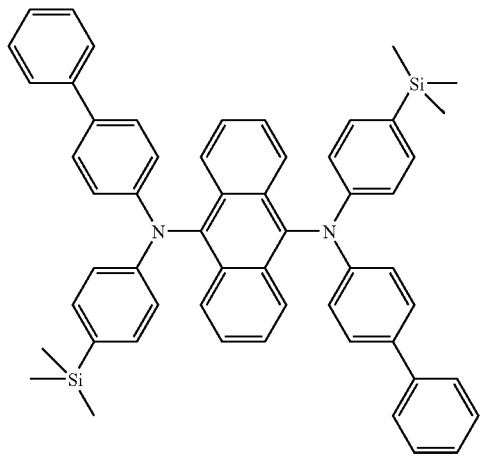

G-38
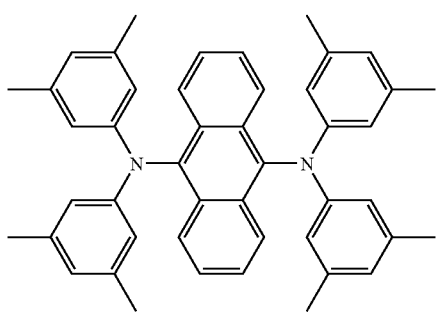

G-39
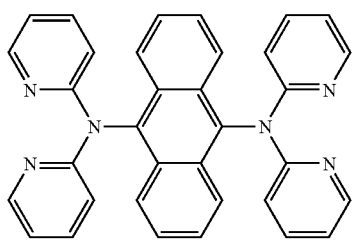

S-40
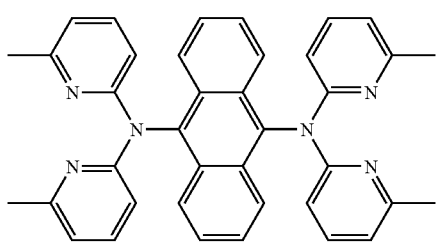

-continued

G-41
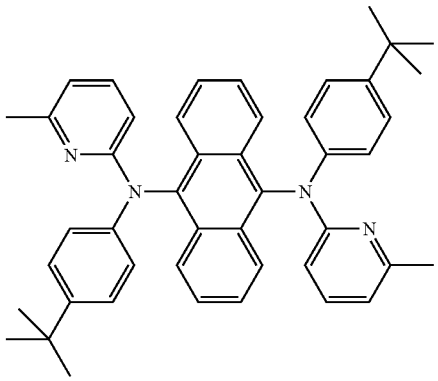

G-42
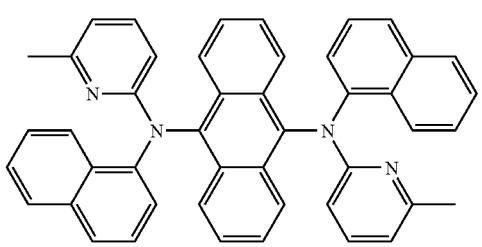

G-43
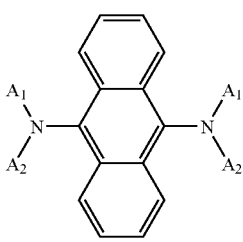

9. An organic electroluminescent device, comprising:
a substrate;
first and second electrodes formed on the substrate; and a light-emitting layer formed between the first electrode and the second electrode, the light-emitting layer containing a green luminescent material represented by using a chemical formula 1 as a dopant:

[Chemical formula 1]

wherein, A1 and A2 are selected from a substituted or non-substituted aromatic group, a substituted or non-substituted heterocyclic group,
wherein the light-emitting layer further contains a host material represented by a chemical formula 2:

B1-X-B2     [Chemical formula 2]

wherein the X is selected from the group consisting of anthracene, and pyrene and B1 and B2 are individually selected from a group consisting of aryl, pyridyl, quinolyl, and isoquinolyl; and
wherein the green luminescent material is at least one of following chemical formulas:
G-2
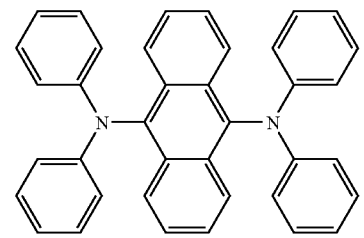
G-3
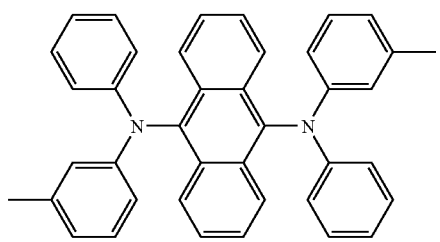
G-4
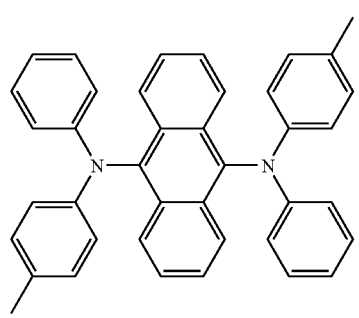
G-7
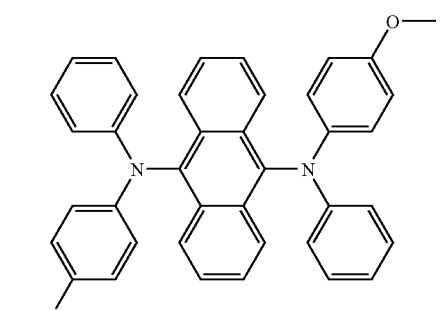
-continued
G-8
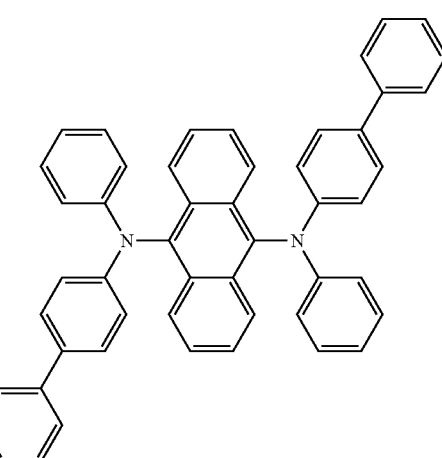
G-10
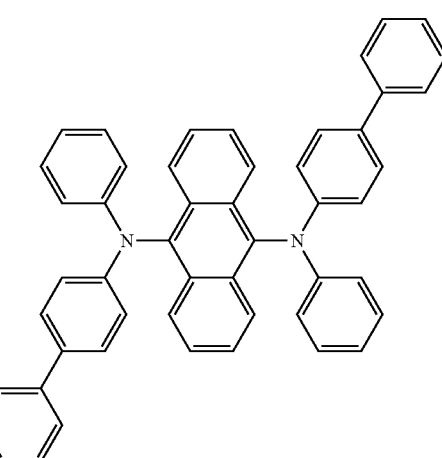
G-11
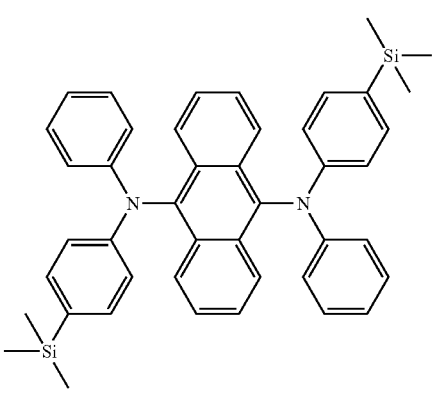
G-13
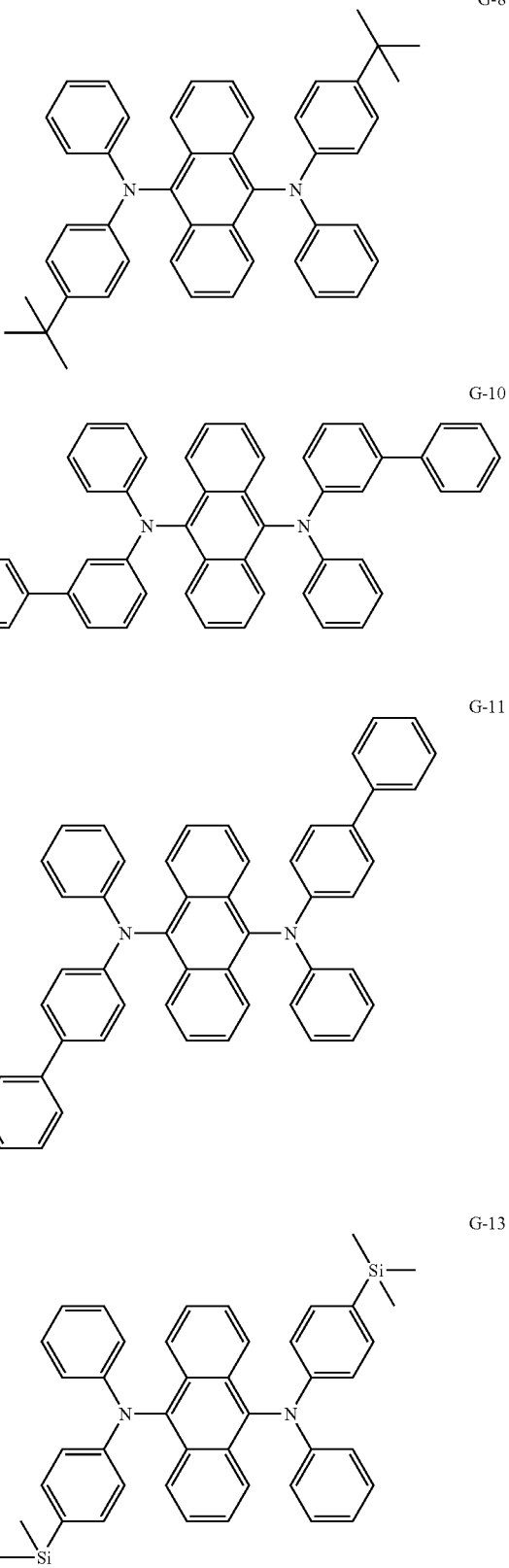

-continued
G-14
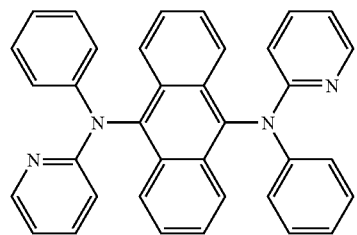
G-15
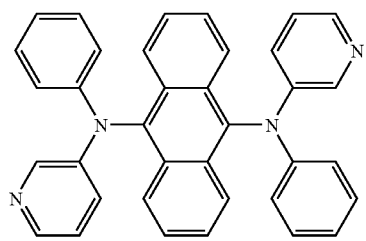
G-16
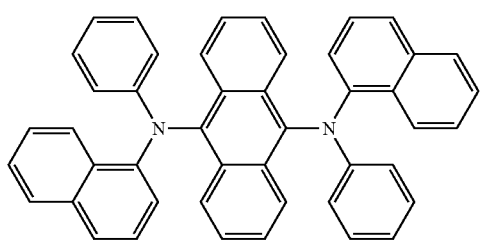
G-18
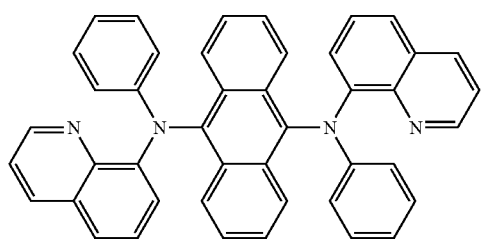
G-19
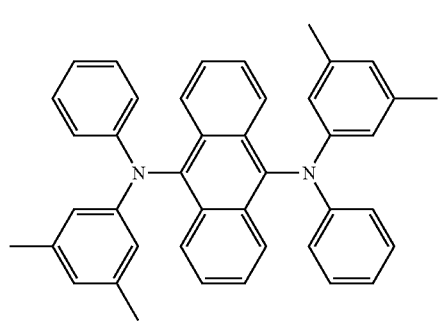
-continued
G-20
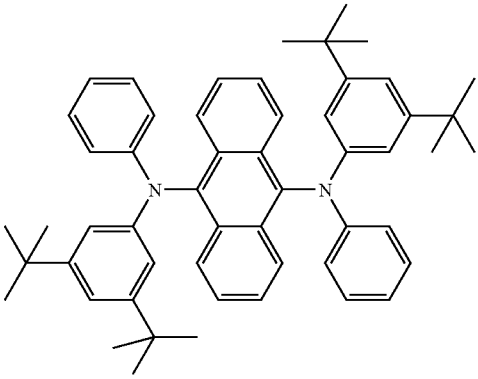
G-21
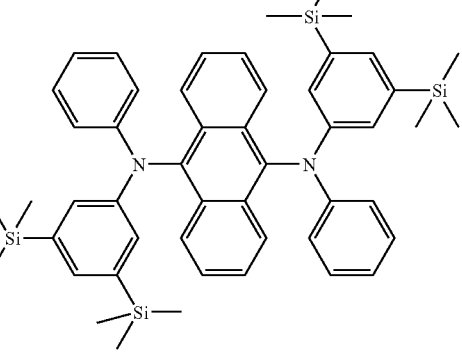
G-22
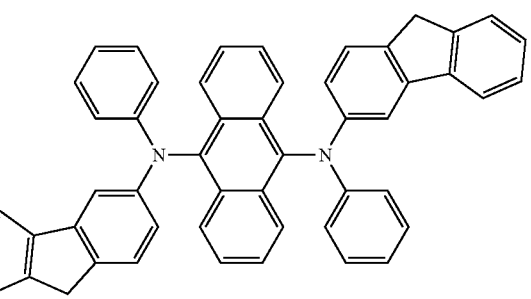
G-24
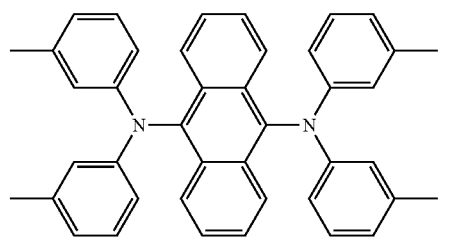

-continued
G-25
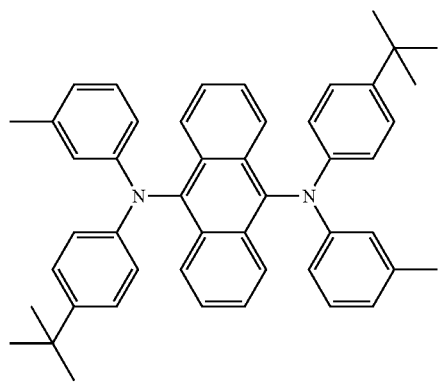
G-26
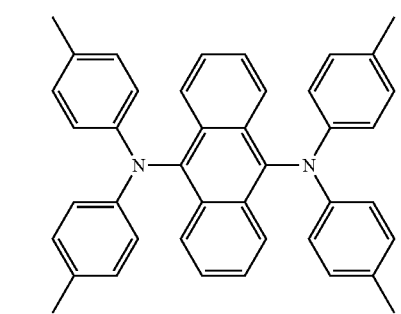
G-27
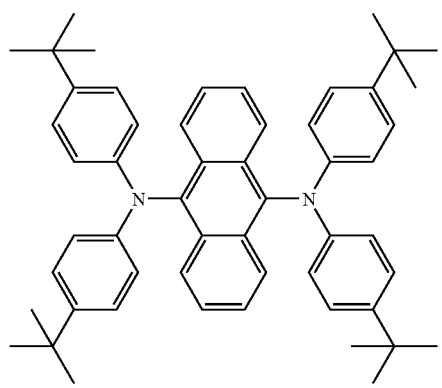
G-28
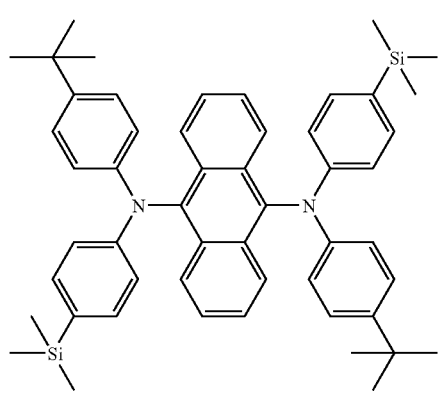
-continued
G-29
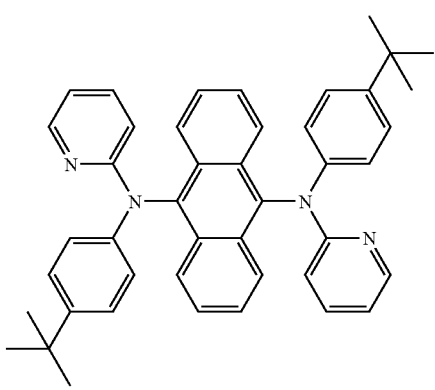
G-30
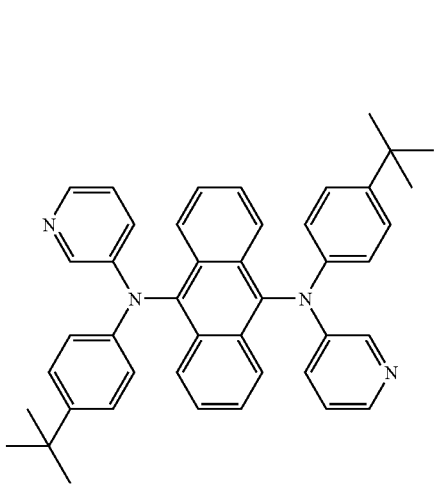
G-31
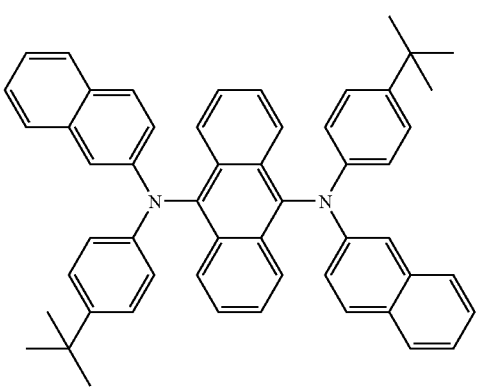
G-33
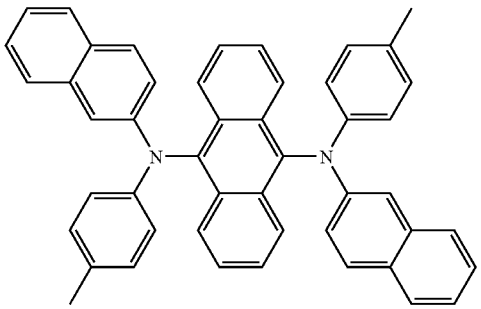

-continued
G-33
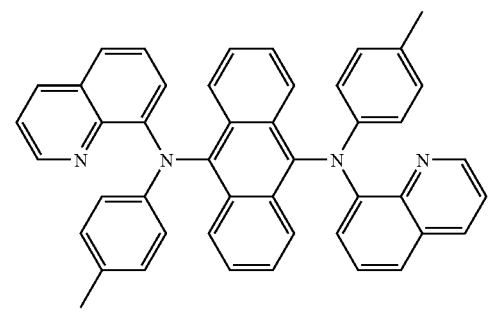
G-34
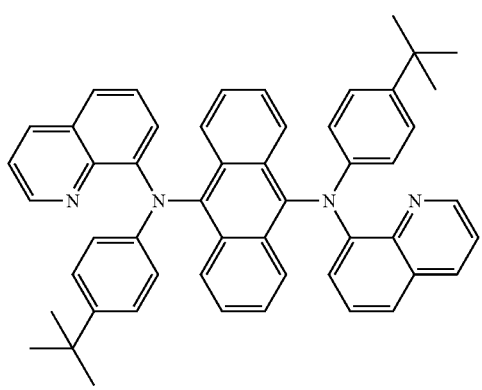
G-35
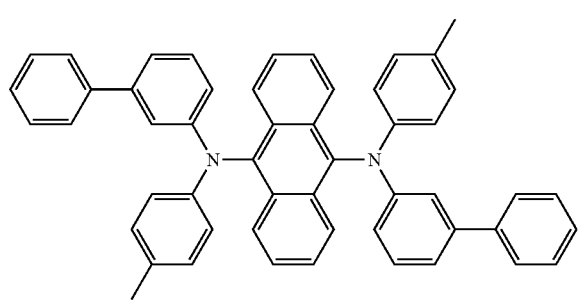
G-36
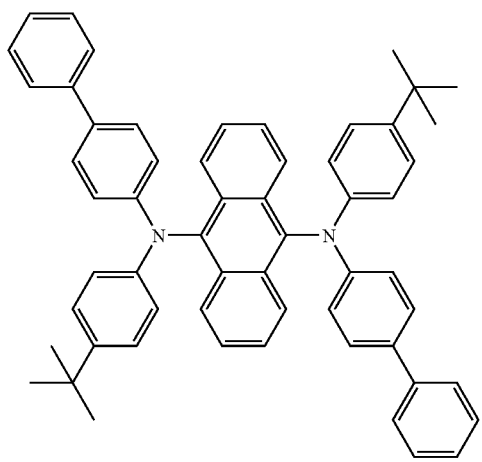
-continued
G-37
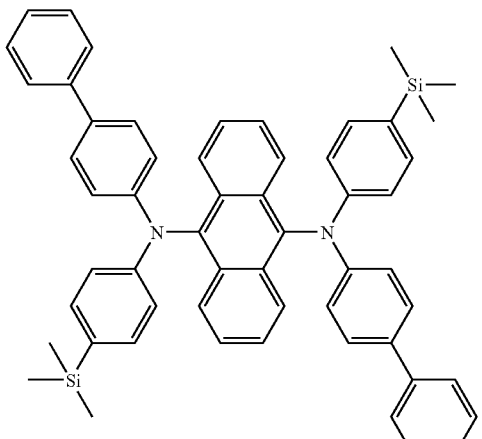
G-38
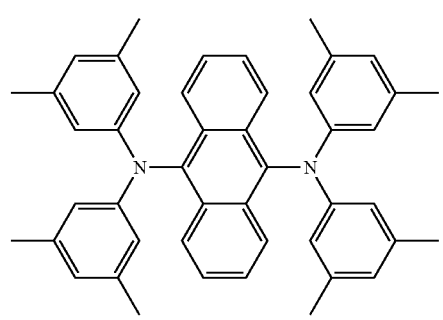
G-39
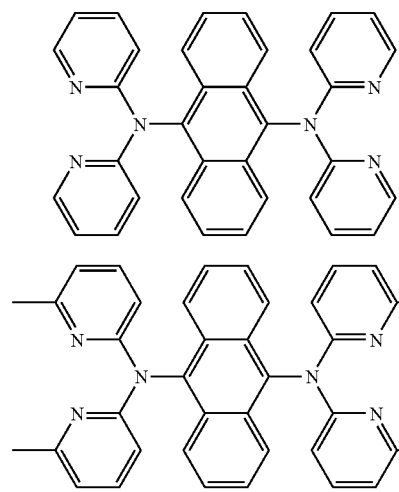
S-40
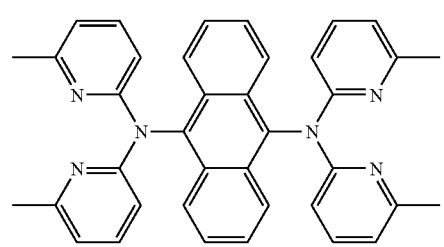
G-41
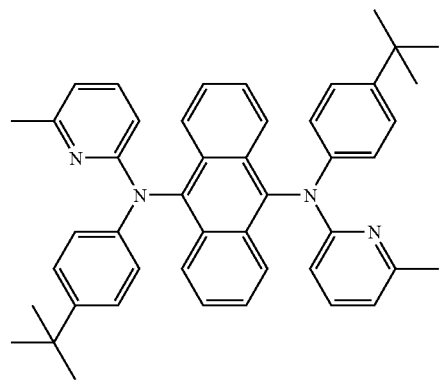

-continued
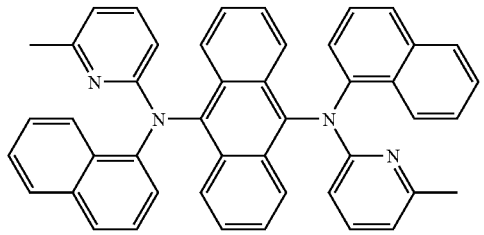
G-42
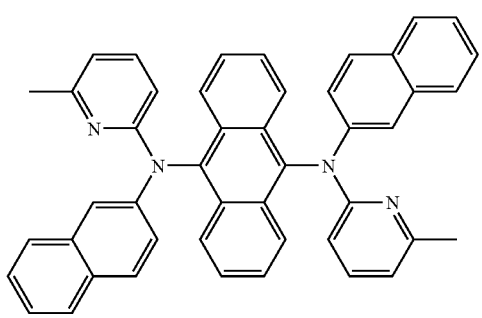
G-43
* * * * *